(12) United States Patent
Yoon et al.

(10) Patent No.: US 10,741,659 B2
(45) Date of Patent: Aug. 11, 2020

(54) SEMICONDUCTOR DEVICE

(71) Applicant: Samsung Electronics Co., Ltd., Suwon-si, Gyeonggi-do (KR)

(72) Inventors: Chang Seop Yoon, Suwon-si (KR); Byoung Wook Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/200,730

(22) Filed: Nov. 27, 2018

(65) Prior Publication Data

US 2019/0326407 A1    Oct. 24, 2019

(30) Foreign Application Priority Data

Apr. 20, 2018  (KR) ........................ 10-2018-0045839

(51) Int. Cl.
*H01L 29/423* (2006.01)
*H01L 27/088* (2006.01)

(52) U.S. Cl.
CPC .... *H01L 29/42376* (2013.01); *H01L 27/0886* (2013.01); *H01L 29/42368* (2013.01)

(58) Field of Classification Search
CPC ......... H01L 29/42376; H01L 29/42368; H01L 27/0886
See application file for complete search history.

(56) References Cited

U.S. PATENT DOCUMENTS

| | | | |
|---|---|---|---|
| 9,324,832 B1 | 4/2016 | Baek et al. | |
| 9,324,866 B2 | 4/2016 | Yu et al. | |
| 9,543,298 B1 | 1/2017 | Zang et al. | |
| 9,634,138 B1 | 4/2017 | Choi et al. | |
| 9,793,273 B2 | 10/2017 | Liaw | |
| 9,865,704 B2 | 1/2018 | Xie et al. | |
| 10,181,426 B1* | 1/2019 | Ching | H01L 29/7856 |
| 2005/0245009 A1* | 11/2005 | Bryant | H01L 29/42368 438/151 |
| 2016/0056292 A1* | 2/2016 | Ho | H01L 29/7851 257/401 |
| 2016/0086943 A1* | 3/2016 | Lee | H01L 29/7848 257/401 |
| 2016/0155741 A1 | 6/2016 | Yoo et al. | |
| 2017/0062420 A1* | 3/2017 | You | H01L 27/0886 |
| 2017/0069621 A1* | 3/2017 | Huang | H01L 27/0629 |

(Continued)

FOREIGN PATENT DOCUMENTS

| | | |
|---|---|---|
| KR | 10-2016-0058404 A | 5/2016 |
| KR | 10-2016-0066103 A | 6/2016 |

*Primary Examiner* — Nathan W Ha

(74) *Attorney, Agent, or Firm* — Harness, Dickey & Pierce, P.L.C.

(57) ABSTRACT

A semiconductor device comprising a first field insulating film around at least a part of a first fin type pattern and at least a part of a second fin type pattern, a second field insulating film between the first fin type pattern and the second fin type pattern and protruding from the first field insulating film and a first gate structure which extends over the first and second field insulating films in a second direction intersecting with a first direction, and includes a first portion on the first field insulating film, and a second portion on the second field insulating film, wherein a first width of the first portion of the first gate structure is greater than a second width of the second portion of the first gate structure.

17 Claims, 37 Drawing Sheets

(56) References Cited

U.S. PATENT DOCUMENTS

| | | |
|---|---|---|
| 2017/0141106 A1* | 5/2017 | Chang ............. H01L 21/823462 |
| 2017/0200651 A1 | 7/2017 | Lee et al. |
| 2017/0256457 A1* | 9/2017 | Deng ................. H01L 21/0332 |
| 2017/0256645 A1 | 9/2017 | Chung et al. |
| 2017/0309611 A1 | 10/2017 | Liu et al. |
| 2017/0352659 A1* | 12/2017 | Basker .............. H01L 29/66795 |
| 2018/0308842 A1* | 10/2018 | Lee ................... H01L 29/66636 |

* cited by examiner

SEMICONDUCTOR DEVICE

This application claims priority from Korean Patent Application No. 10-2018-0045839 filed on Apr. 20, 2018 in the Korean Intellectual Property Office, the disclosure of which is incorporated herein by reference in its entirety.

BACKGROUND

1. Field of the Inventive Concepts

The present inventive concepts relate to a semiconductor device.

2. Description of the Related Art

As one of scaling techniques for increasing the density of a semiconductor device, a multi-gate transistor in which a silicon body having a fin shape or a nanowire shape is formed on the substrate and a gate is formed on the surface of the silicon body is proposed.

Since such a multi-gate transistor utilizes three-dimensional channels, scaling is easily performed. Furthermore, the current control capability can be improved, without increasing the gate length of the multi-gate transistor. Furthermore, it is possible to effectively suppress a short channel effect (SCE) in which the potential of the channel region is affected by the drain voltage.

SUMMARY

Aspects of the present inventive concepts provide a semiconductor device capable of securing a margin of a manufacturing process of the semiconductor device and/or improving a yield of the semiconductor device, when a single diffusion break is used.

The aspects of the present inventive concepts are not limited to those mentioned above and another aspect which is not mentioned may be clearly understood by those skilled in the art from the description below.

According to some embodiments of the inventive concepts, there is provided a semiconductor device comprising a first fin type pattern and a second fin type pattern extending in a first direction and spaced apart from each other in the first direction, a first field insulating film around at least a part of the first fin type pattern and at least a part of the second fin type pattern, a second field insulating film disposed between the first fin type pattern and the second fin type pattern and protruding from the first field insulating film and a first gate structure which extends over the first and second field insulating films in a second direction intersecting with the first direction, and includes a first portion on the first field insulating film, and a second portion on the second field insulating film, wherein a first width of the first portion of the first gate structure is greater than a second width of the second portion of the first gate structure.

According to embodiments of the inventive concepts, there is provided a semiconductor device comprising a first fin type pattern and a second fin type pattern extending in a first direction and spaced apart from each other in the first direction, a first field insulating film around at least a part of the first fin type pattern and at least a part of the second fin type pattern, a second field insulating film disposed between the first fin type pattern and the second fin type pattern and protruding from the first field insulating film, a first gate structure which extends over the first and second field insulating films in a second direction intersecting with the first direction, and including a first portion on the first field insulating film, and a second portion on the second field insulating film and a first gate spacer which includes a first spacer part disposed on the first field insulating film along both sidewalls of a first portion of the first gate structure, and a second spacer part disposed on the second field insulating film along both sidewalls of the second portion of the first gate structure, wherein the sum of a first width of the first portion of the first gate structure and a width of the first spacer part is greater than the sum of a second width of the second portion of the first gate structure and a width of the second spacer part.

According to embodiments of the inventive concepts, there is provided a semiconductor device comprising a first fin type pattern and a second fin type pattern extending in a first direction and spaced apart from each other in the first direction, a first field insulating film around at least a part of the first fin type pattern and at least a part of the second fin type pattern and a first gate structure disposed on the first field insulating film and extending in a second direction intersecting with the first direction between the first fin type pattern and the second fin type pattern, wherein the first gate structure includes a first portion which is not disposed between the first fin type pattern and the second fin type pattern, and a second portion which is disposed between the first fin type pattern and the second fin type pattern, and a first width of the first portion of the first gate structure is greater than a second width of a second portion of the first gate structure.

BRIEF DESCRIPTION OF THE DRAWINGS

The above and other aspects and features of the present inventive concepts will become more apparent by describing in detail example embodiments thereof with reference to the attached drawings, in which:

FIG. 4b is an enlarged view of a region R of FIG. 4a;

FIG. 6 is a cross-sectional view taken along line A-A' of FIG. 4a;

FIG. 7 is a cross-sectional view taken along line B-B' of FIG. 4a;

FIG. 8 is a cross-sectional view taken along the line C-C' of FIG. 4a;

DETAILED DESCRIPTION OF EMBODIMENTS

Figure 1:
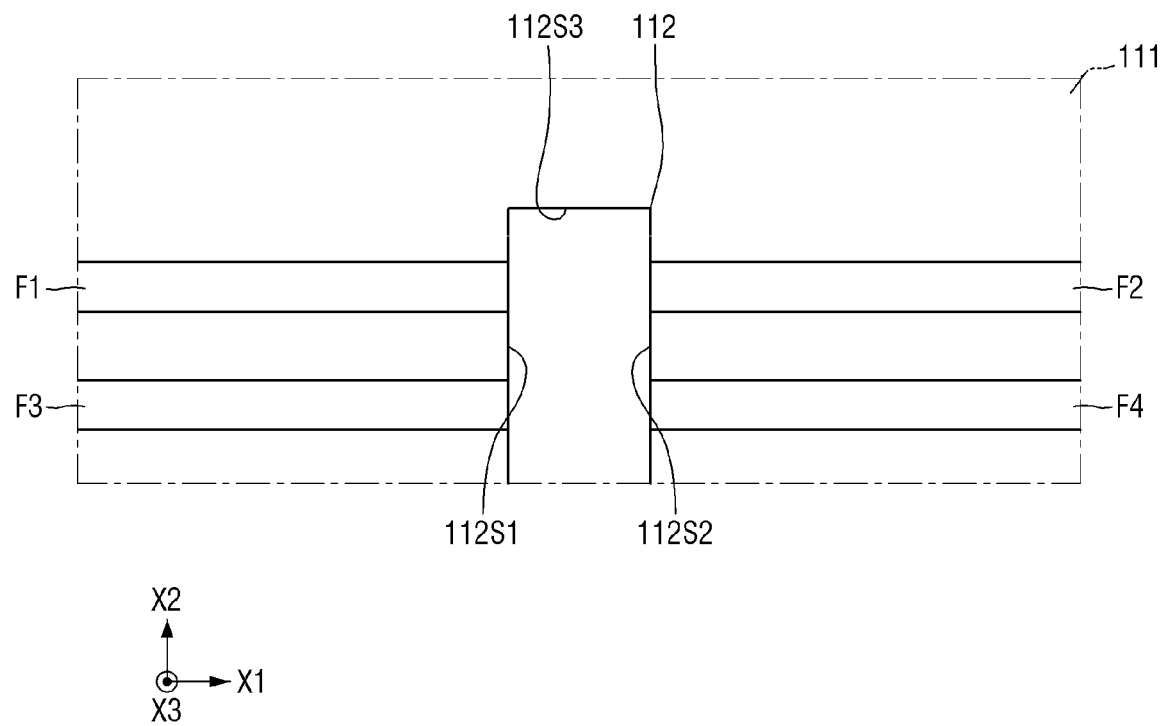
FIG. 1 a layout diagram for explaining a semiconductor device according to some embodiments of the technical idea of the present inventive concepts.

In the drawings of the semiconductor device according to some embodiments of the present inventive concepts, a fin type transistor (FinFET) including a channel region of a fin type pattern shape is illustrated, but the present inventive concepts are not limited thereto. It is a matter of course that the semiconductor device according to some embodiments of the present inventive concepts may include a tunneling transistor FET or a three-dimensional 3D transistor. In addition, the semiconductor device according to some embodiments of the present inventive concepts may include a bipolar junction transistor, a lateral double diffused transistor (LDMOS), or the like.

Although the semiconductor device according to some embodiments of the present inventive concepts is described as a multi-channel transistor using a fin type pattern, the semiconductor device may be a planar or other transistor.

Hereinafter, the semiconductor device according to some embodiments of the technical idea of the present inventive concepts will be described with reference to FIGS. 1 to 8.

Figure 2:
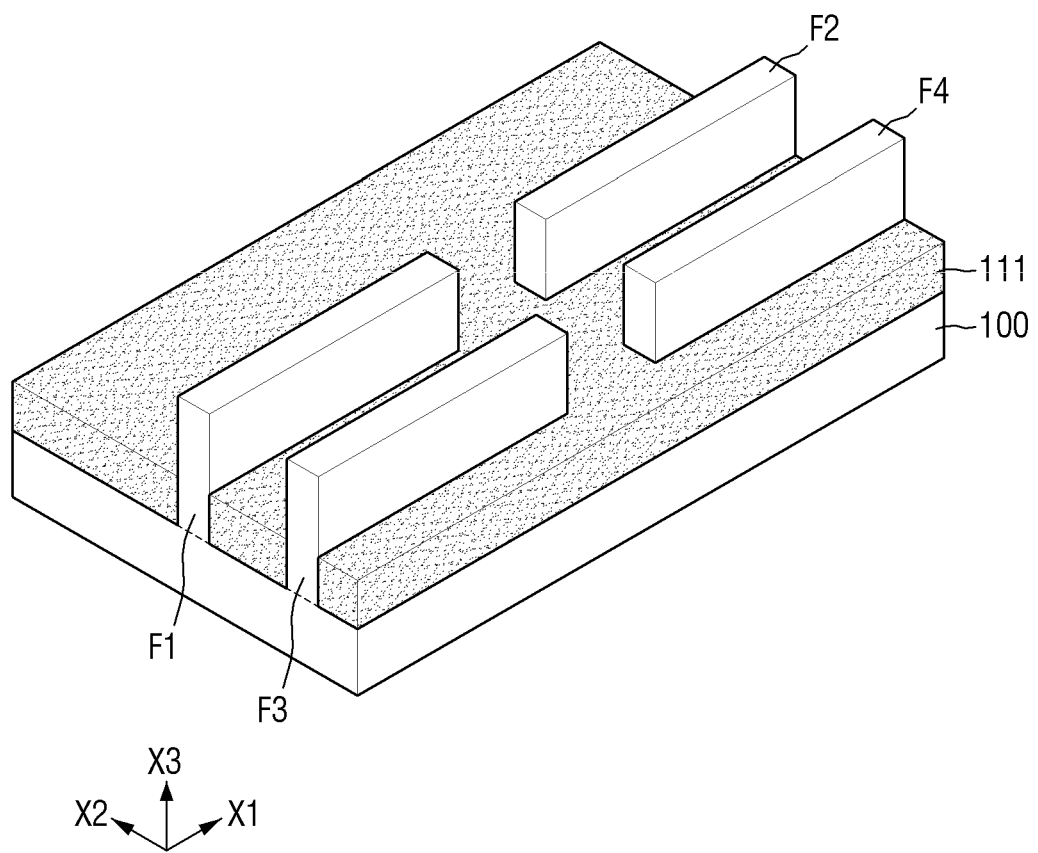
FIGS. 2 and 3 are perspective views for explaining the semiconductor device according to some embodiments of the technical idea of the present inventive concepts.
Figure 3:
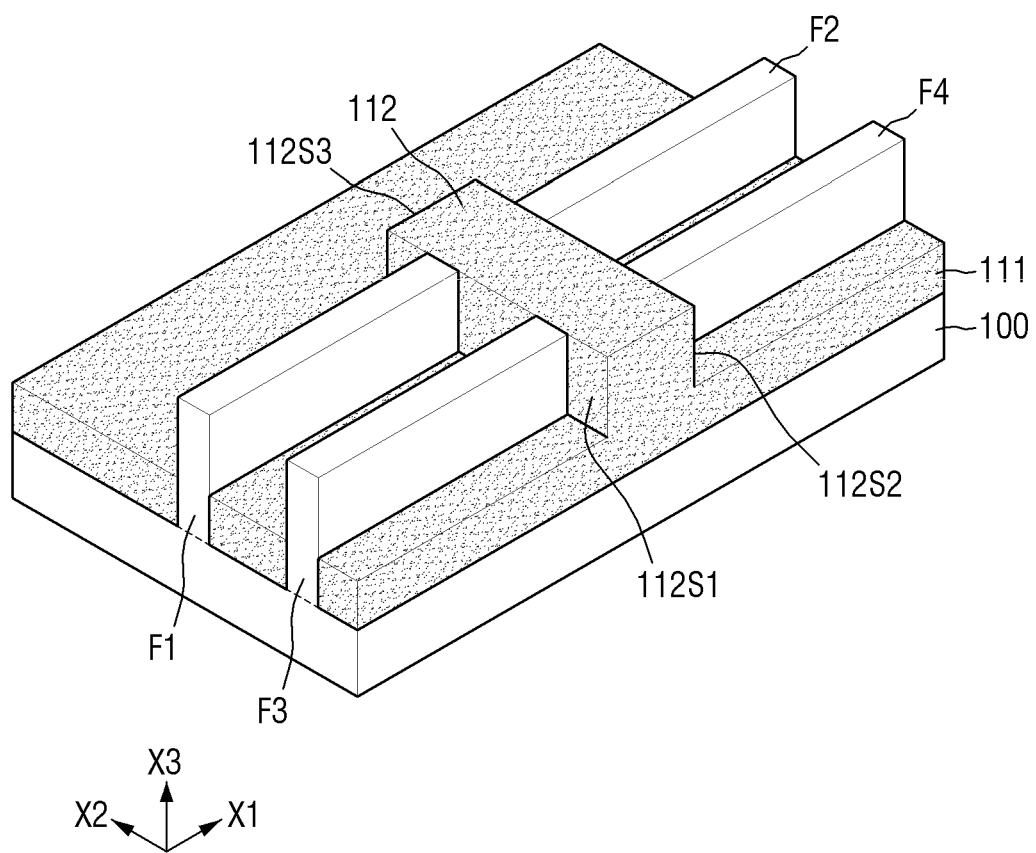

FIG. 1 is a layout diagram for explaining the semiconductor device according to some embodiments of the technical idea of the present inventive concepts. FIGS. 2 and 3 are perspective views for explaining the semiconductor device according to some embodiments of the technical idea of the present inventive concepts. More specifically, FIG. 2 is a view for explaining a first field insulating film 111, and FIG. 3 is a view for explaining a second field insulating film 112.

Referring to FIGS. 1 to 3, each of the first, second, third, and fourth fin type patterns F1, F2, F3, and F4 may extend in a first direction X1.

The substrate 100 may be, for example, bulk silicon or silicon-on-insulator (SOI). Alternatively, the substrate 100 may be a silicon substrate or include other material, for example, silicon germanium, indium antimonide, lead tellurium compounds, indium arsenide, indium phosphide, gallium arsenide or gallium antimonide. Or, the substrate 100 may have an epitaxial layer formed on a base substrate.

Each of the first, second, third, and fourth fin type patterns F1, F2, F3, and F4 may protrude from the substrate 100. For example, each of the first, second, third, and fourth fin type patterns F1, F2, F3, and F4 may extend from the upper surface of the substrate 100 in a third direction X3.

The first and second fin type patterns F1 and F2 may be spaced apart from each other in the first direction X1. The third and fourth fin type patterns F3 and F4 may be spaced apart from each other in the first direction X1. The first and third fin type patterns F1 and F3 may be spaced apart from each other in the second direction X2. The second and fourth fin type patterns F2 and F4 may be spaced apart from each other in the second direction X2.

The second direction X2 may be a direction intersecting with the first direction X1. In addition, the third direction X3 may be a direction intersecting with each of the first and second directions X1 and X2.

In the drawings, the respective sidewalls of the first and second fin type patterns F1 and F2 are illustrated as having an inclination perpendicular to the upper surface of the substrate 100, but the technical idea of the present inventive concepts is not limited thereto. For example, the respective sidewalls of the first and second fin type patterns F1 and F2 may have an arbitrary inclination with respect to the substrate 100.

Alternatively, or additionally, for example, the first, second, third, and fourth fin type patterns F1, F2, F3, and F4 may also have a tapered shape. Alternatively, or additionally, for example, the first, second, third and fourth fin type patterns F1, F2, F3, and F4 may have a chamfered shape.

The first, second, third, and fourth fin type patterns F1, F2, F3, and F4 may include, for example, silicon or germanium which are element semiconductor materials. Further, the first, second, third, and fourth fin type patterns F1, F2, F3, and F4 may include a compound semiconductor, and may include, for example, a group IV-IV compound semiconductor or a group III-V compound semiconductor. For example, taking the W-W group compound semiconductor as an example, the first, second, third and fourth fin type patterns F1, F2, F3, and F4 may be a binary compound or a ternary compound containing at least two or more of carbon (C), silicon (Si), germanium (Ge), and tin (Sn), or a compound obtained by doping these elements with a group IV element. For example, taking the III-V compound semiconductor as an example, the first, second, third, and fourth fin type patterns F1, F2, F3, and F4 may be one of a binary compound, a ternary compound or a quaternary compound formed by combination of at least one of aluminum (Al), gallium (Ga) and indium (In) as a group III element, and one of phosphorus (P), arsenic (As) or antimony (Sb) as a group V element.

The first field insulating film 111 may wrap at least a part of each of the first, second, third, and fourth fin type patterns F1, F2, F3, and F4 on the substrate 100. When the first field insulating film 111 wraps around some parts of each of the first, second, third, and fourth fin type patterns F1, F2, F3, and F4, each of the first, second, third, and fourth fin type patterns F1, F2, F3, and F4 may protrude from the upper surface of the first field insulating film 111.

The second field insulating film 112 may be disposed between the first fin type pattern F1 and the second fin type pattern F2, and between the third fin type pattern F3 and the fourth fin type pattern F4. The second field insulating film 112 may be disposed on the first field insulating film 111. The second field insulating film 112 may protrude from the first field insulating film 111. For example, the second field insulating film 112 may protrude from the upper surface of the first field insulating film 111 in the third direction X3. The second field insulating film 112 may extend in the second direction X2, between the first fin type pattern F1 and the second fin type pattern F2, and between the third fin type pattern F3 and the fourth fin type pattern F4. The second field insulating film 112 may insulate the first and second fin type patterns F1 and F2 from each other. In addition, the second field insulating film 112 may insulate the fourth and fourth fin type patterns F3 and F4 from each other.

The second field insulating film 112 may include a first sidewall 112S1 being in contact with the other sidewall of the first and third fin type patterns F1 and F3, and a second sidewall 112S2 being in contact with one sidewall of the second and fourth fin type patterns F2 and F4. The first sidewall 112S1 and the second sidewall 112S2 of the second field insulating film 112 may face each other and extend in the second direction X2, respectively. The third sidewall 112S3 of the second field insulating film 112 may extend in the first direction X1, and may connect the first sidewall 112S1 and the second sidewall 112S2 of the second field insulating film 112.

The first and second field insulating films 111 and 112 may be formed of a material including at least one of, for example, a silicon oxide film, a silicon nitride film, and a silicon oxynitride film.

In some embodiments, the upper surface of the second field insulating film 112, the upper surface of the first fin type pattern F1 and the upper surface of the second fin type pattern F2 may be formed on the same plane. However, the technical idea of the present inventive concepts is not limited thereto. For example, the upper surface of the second field insulating film 112 may be located to be lower or higher than the upper surface of the first fin type pattern F1 and the upper surface of the second fin type pattern F2.

Figure 4A:
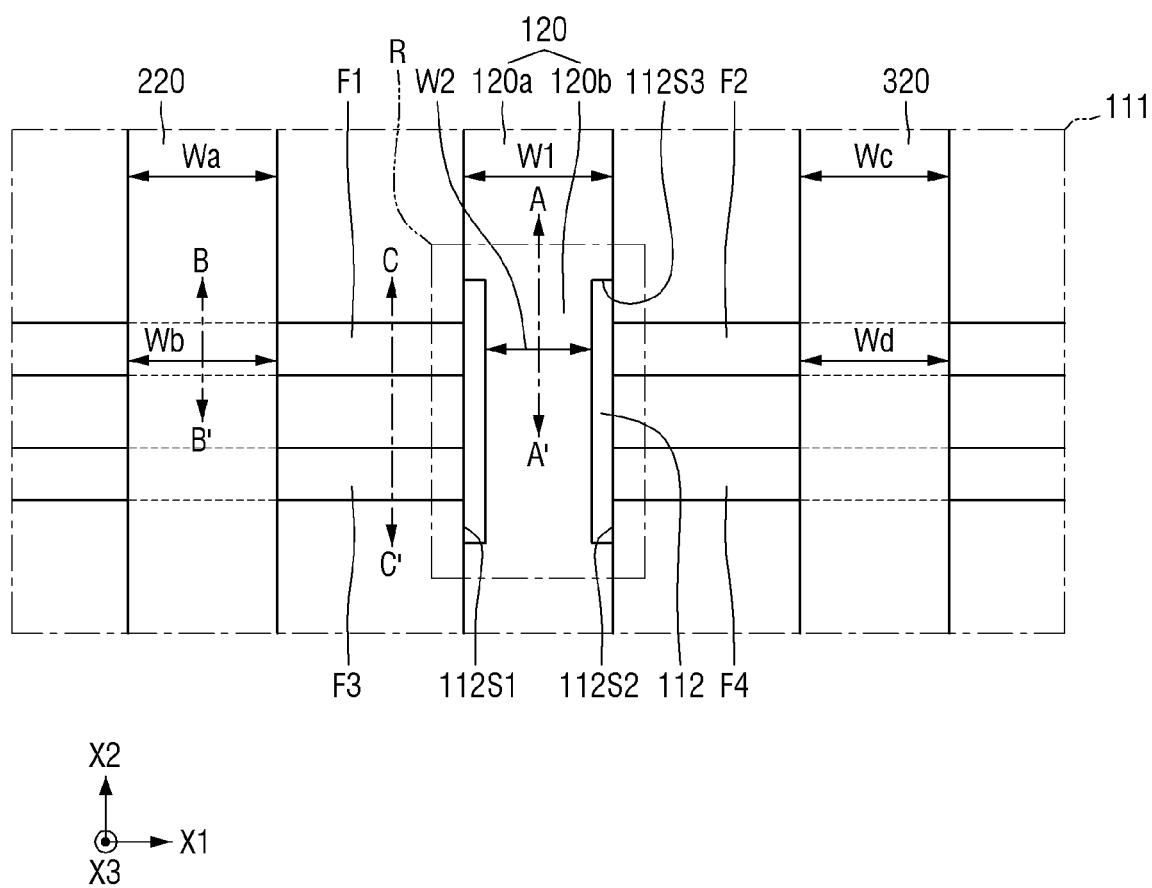
FIG. 4a is a layout diagram for explaining the semiconductor device according to some embodiments of the technical idea of the present inventive concepts.

FIG. 4a is a layout diagram for explaining a semiconductor device according to some embodiments of the technical idea of the present inventive concepts. FIG. 4a is a diagram illustrating the configuration in which the first, second and third gate structures 120, 220, and 320 are disposed in the layout diagram of FIG. 1. In FIG. 4a, the first and second gate electrode layers MG1 and MG2 and the gate insulating film are not illustrated for clarity of illustration.

Figure 4B:
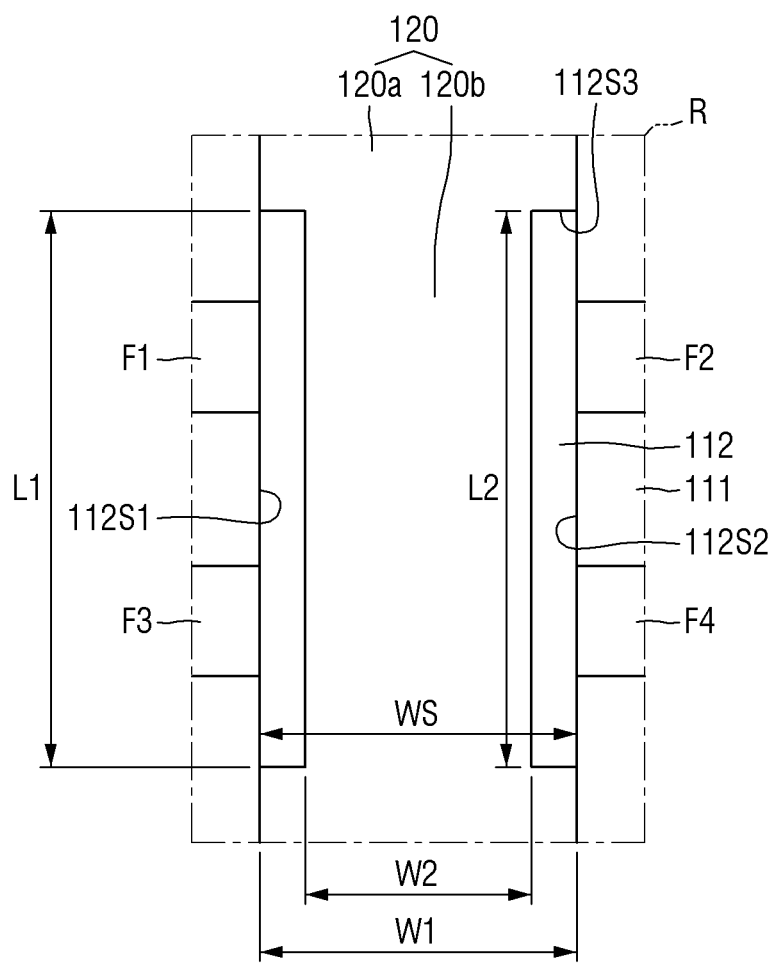
Figure 5:
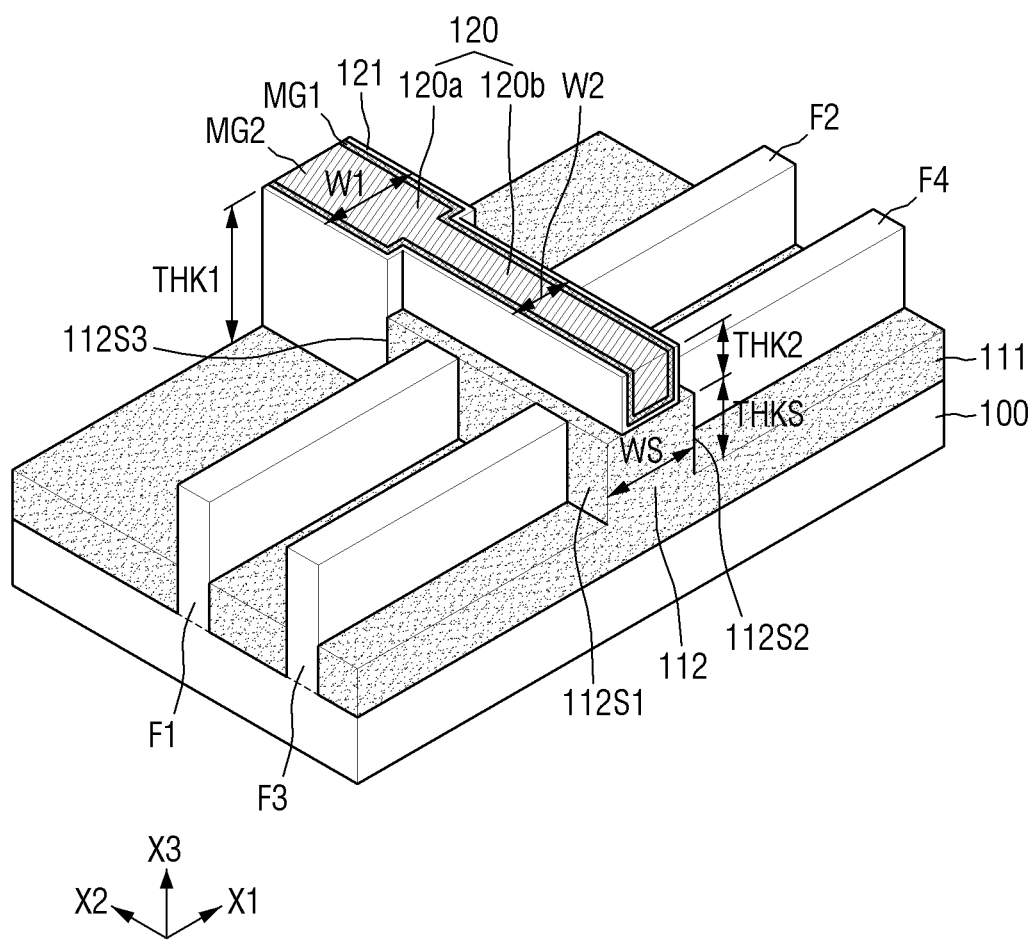
FIG. 5 is a perspective view for explaining the semiconductor device according to some embodiments of the technical idea of the present inventive concepts.

FIG. 4b is an enlarged view of a region R of FIG. 4a. FIG. 5 is a perspective view for explaining the semiconductor device according to some embodiments of the technical idea of the present inventive concepts. In FIGS. 4a and 5, the gate spacer is not illustrated for clarity of illustration. FIG. 5 is a partial perspective views illustrating only a partial region of the layout diagram of FIG. 4a for clarity of illustration.

Figure 6:
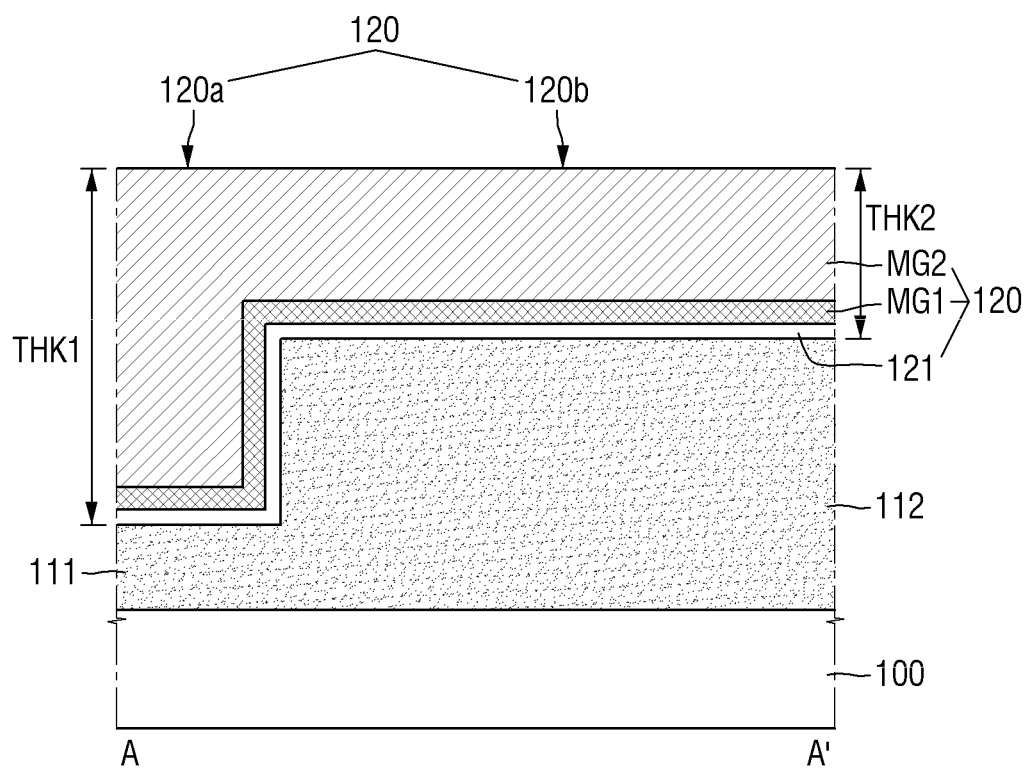
Figure 6:
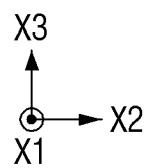
Figure 7:
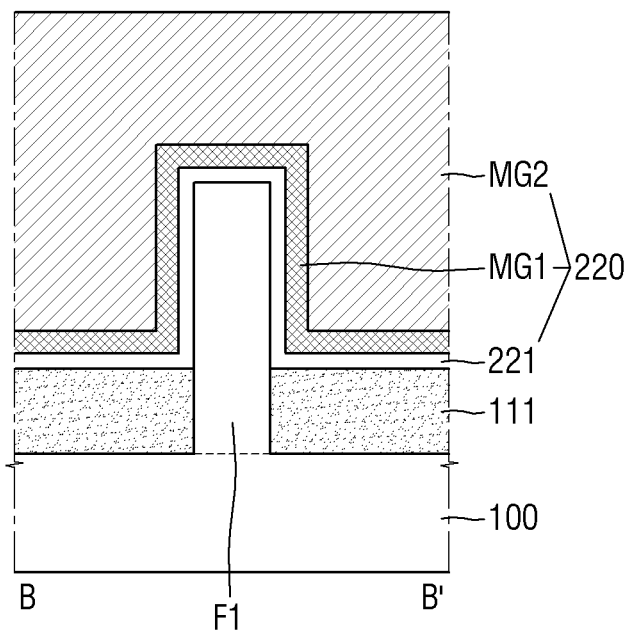
Figure 8:
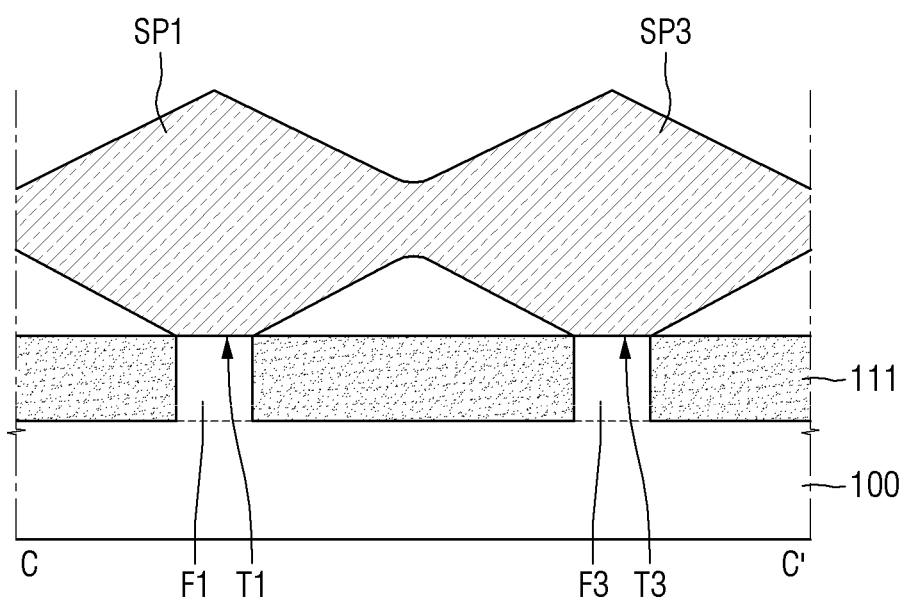

FIG. 6 is a cross-sectional view taken along line A-A' of FIG. 4a. FIG. 7 is a cross-sectional view taken along line B-B' of FIG. 4a. FIG. 8 is a cross-sectional view taken along the line C-C' of FIG. 4a.

Referring to FIGS. 4a to 8, the semiconductor device according to some embodiments of the technical idea of the present inventive concepts may include a first gate structure 120 including a first portion 120a and a second portion 120b.

The first gate structure 120 may be disposed on the first and second field insulating films 111 and 112. The first gate structure 120 may extend over the first and second field insulating films 111 and 112 in the second direction X2. The first gate structure 120 may extend in the second direction X2 between the first fin type pattern F1 and the second fin type pattern F2, and between the third fin type pattern F3 and the fourth fin type pattern F4.

The first portion 120a of the first gate structure 120 may be a portion on the first field insulating film 111. The first portion 120a of the first gate structure 120 may be a portion that does not overlap the second field insulating film 112 in the third direction X3. In some embodiments, the first portion 120a of the first gate structure 120 may be a portion which is not disposed between the first fin type pattern F1 and the second fin type pattern F2, and between the third fin type pattern F3 and the fourth fin type pattern F4. The first portion 120a of the first gate structure 120 may be in contact with the third sidewall 112S3 of the second field insulating film 112. The first portion 120a of the first gate structure 120 may be a portion having a first width W1.

The second portion 120b of the first gate structure 120 may be a portion on the second field insulating film 112. The second portion 120b of the first gate structure 120 may be a portion which overlaps the second field insulating film 112 in the third direction X3. In some embodiments, the second portion 120b of the first gate structure 120 may be a portion disposed between the first fin type pattern F1 and the second fin type pattern F2, and between the third fin type pattern F3 and the fourth fin type pattern F4. The second portion 120b of the first gate structure 120 may be a portion having a second width W2.

The first gate structure 120 and the second field insulating film 112 may constitute a single diffusion break.

The first width W1 of the first portion 120a of the first gate structure 120 may be greater than the second width W2 of the second portion 120b of the first gate structure 120.

A width WS of the second field insulating film 112 may be greater than the second width W2 of the second portion 120b of the first gate structure 120. However, the technical idea of the present inventive concepts is not limited thereto. For example, the width WS of the second field insulating film 112 may be the same as the second width W2 of the second portion 120b of the first gate structure 120.

In the drawing, the first width W1 of the first portion 120a of the first gate structure 120 and the width WS of the second field insulating film 112 are illustrated as being substantially the same, but the technical idea of the present inventive concepts is not limited thereto. For example, the first width W1 of the first portion 120a of the first gate structure 120 may be different from the width WS of the second field insulating film 112.

Each of the first width W1, the second width W2 and the width WS of the second field insulating film 112 may be measured in the first direction X1.

In the semiconductor device according to the technical idea of the present inventive concepts, by making the first width W1 of the first portion 120a of the first gate structure 120 greater than the second width W2 of the second portion 120b, it is possible to secure a process margin in the manufacturing process of the semiconductor device, and/or to improve the yield of the semiconductor device.

In some embodiments, a length L1 of the second field insulating film 112 may be the same as a length L2 of the second portion 120b of the first gate structure 120. Each of the length L1 of the second field insulating film 112 and the length L2 of the second portion 120b of the first gate structure 120 may be the values measured in the second direction X2.

A first thickness THK1 of the first portion 120a of the first gate structure 120 may be greater than a second thickness THK2 of the second portion 120b of the first gate structure 120. For example, the first thickness THK1 of the first portion 120a of the first gate structure 120 may be the same as the sum of the second thickness THK2 of the second portion 120b of the first gate structure 120 and the thickness THKS of the second field insulating film 112.

Each of the first thickness THK1, the second thickness THK2 and the thickness THKS of the second field insulating film 112 may be the values measured in the third direction X3.

Each of the second gate structure 220 and the third gate structure 320 may be disposed to be spaced apart from the first gate structure 120 in the first direction X1. Each of the second gate structure 220 and the third gate structure 320 may extend in the second direction X2.

The second gate structure 220 may be disposed on the first field insulating film 111, the first fin type pattern F1 and the third fin type pattern F3. In some embodiments, a width Wb of the portion of the second gate structure 220 disposed on the first and third fin type patterns F1 and F3 may be, for example, the same as a width Wa of the portion of the second gate structure 220 which is not disposed on the first and third type patterns F1 and F3.

The third gate structure 320 may be disposed on the first field insulating film 111, the second fin type pattern F2 and the fourth fin type pattern F4. In some embodiments, the width Wd of the portion of the third gate structure 320 disposed on the second and fourth fin type patterns F2 and F4 may be, for example, the same as the width We of the portion of the second gate structure 220 which is not disposed on the second and fourth fin type patterns F2 and F4.

The first gate structure 120 may include a first gate insulating film 121, a first gate electrode layer MG1 and a second gate electrode layer MG2.

The first gate insulating film 121 may be disposed on the first and second field insulating films 111 and 112. The first gate insulating film 121 may be disposed between the first gate electrode layer MG1 and the first field insulating film 111, and between the first gate electrode layer MG1 and the second field insulating film 112. The first gate insulating film 121 may be disposed along the profile of the first and second field insulating films 111 and 112.

The first gate insulating film 121 may form one sidewall and the other sidewall of the first gate structure 120. In other words, the first gate insulating film 121 may include a portion extending from the upper surfaces of each of the first and second field insulating films 111 and 112 in the third direction X3.

In some embodiments, the first gate structure 120 may further include an interfacial film. The interfacial film may be interposed between the first and second field insulating films 111 and 112 and the first gate insulating film 121.

In the drawings, the first gate insulating film 121 is illustrated as having a single film structure, but the technical idea of the present inventive concepts is not limited thereto. For example, the first gate insulating film 121 may have a multilayer structure such as including one or more high dielectric constant insulating films.

For example, the first gate insulating film 121 may include, but is not limited to, one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The first gate electrode layer MG1 may be disposed on the first gate insulating film 121 along the profile of the first gate insulating film 121. The second gate electrode layer MG2 may be disposed on the first gate electrode layer MG1. The first gate electrode layer MG1 and the second gate electrode layer MG2 may include, for example, a work function adjusting metal layer, and a metal layer for filling a space formed by the work function adjusting metal layer.

In the drawings, each of the first gate electrode layer MG1 and the second gate electrode layer MG2 is illustrated as having a single film structure, but the technical idea of the present inventive concepts is limited thereto. For example, each of the first gate electrode layer MG1 and the second gate electrode layer MG2 may have a structure in which two or more metal layers are stacked.

At least one of the first gate electrode layer MG1 and the second gate electrode layer MG2 may include, for example, a conductive material. Examples of these conductive materials may include doped polysilicon, titanium nitride (TiN), tantalum nitride (TaN), tungsten nitride (WN), titanium (Ti), tantalum (Ta) and tungsten (W), but the technical idea of the present inventive concepts is not limited thereto.

The second gate structure 220 may include a second gate insulating film 221, a first gate electrode layer MG1, and a second gate electrode layer MG2.

The second gate insulating film 221 may be disposed on the upper surface of the first field insulating film 111. Further, the second gate insulating film 221 may be disposed along the upper surface and the sidewalls of the portions of the first and third fin type patterns F1 and F3 protruding from the first field insulating film 111. The second gate insulating film 221 may include a portion extending from the upper surface of the first field insulating film 111 in the third direction X3. Further, the second gate insulating film 221 may include a portion extending from the upper surfaces of each of the first fin type pattern F1 and the third fin type pattern F3 in the third direction X3.

The second gate insulating film 221 may include the same material as that of the first gate insulating film 121.

Each of the first and third semiconductor patterns SP1 and SP3 may be disposed in the first and third trenches T1 and T3 formed in each of the first and third fin type patterns F1 and F3.

In the drawings, each of the first and third semiconductor patterns SP1 and SP3 is illustrated as having a specific shape, but the technical idea of the present inventive concepts is not limited thereto.

The first and third semiconductor patterns SP1 and SP3 may be a source/drain of a transistor formed by the first fin type pattern F1, the third fin type pattern F3, and the second gate structure 220, and may be, for example, an elevated source/drain.

In some embodiments, the first and third semiconductor patterns SP1 and SP3 may be in contact with each other or merged. That is, the electrically same voltage signal may be applied to the first and third semiconductor patterns SP1 and SP3. However, the technical idea of the present inventive concepts is not limited thereto. For example, it is a matter of course that the first and third semiconductor patterns SP1 and SP3 may not be in contact with each other or merged.

In the case where the transistor formed using the first fin type pattern F1, the third fin type pattern F3 and the second gate structure 220 is a PMOS transistor, the first and third semiconductor patterns SP1 and SP3 may include compressive stress materials. For example, the compressive stress material may be a material having a larger lattice constant than Si, for example, SiGe. The compressive stress material may apply a compressive stress to the first fin type pattern F1 and the third fin type pattern F3 to improve mobility of carrier of the channel region.

In the case where the transistor formed using the first fin type pattern F1, the third fin type pattern F3 and the second gate structure 220 is an NMOS transistor, the first and third SP1 and SP3 may be the same material as the substrate 100 or a tensile stress material. For example, when the substrate 100 is Si, the first and third semiconductor patterns SP1 and SP3 may be Si or a material (e.g., SiC) having a lattice constant smaller than Si.

Hereinafter, the semiconductor device according to some embodiments of the technical idea of the present inventive concepts will be described with reference to FIG. 9. For the sake of clarity of explanation, repeated parts of above description will be simplified or omitted.

Figure 9:
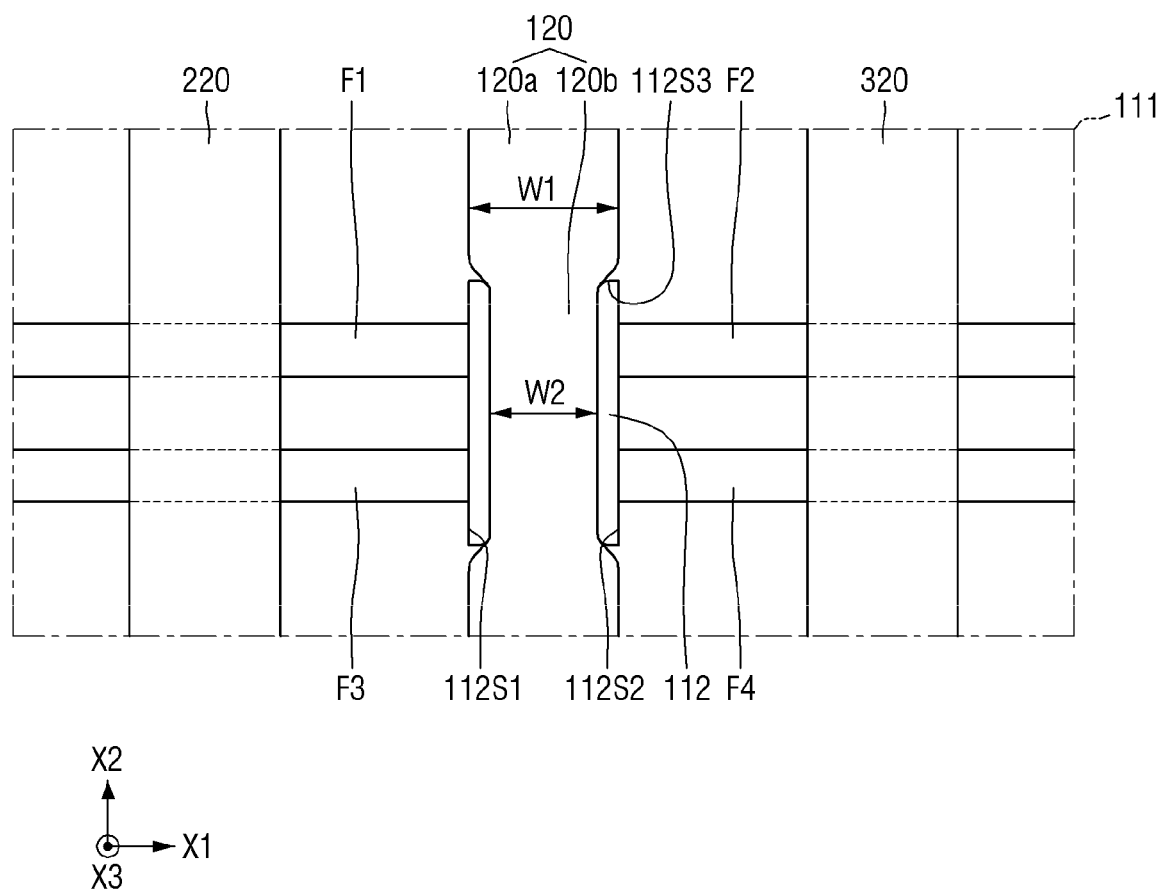
FIGS. 9, 10, and 11 are layout diagrams for explaining the semiconductor device according to some embodiments of the technical idea of the present inventive concepts.

FIG. 9 is a layout diagram for explaining the semiconductor device according to some embodiments of the technical idea of the present inventive concepts. FIG. 9 is a diagram illustrating the configuration in which the first, second and third gate structures 120, 220, and 320 are disposed in the layout diagram of FIG. 1. In FIG. 9, for clarity of illustration, the first and second gate electrode layers MG1 and MG2 and the gate insulating film are not illustrated.

Referring to FIG. 9, a boundary between the first portion 120a and the second portion 120b of the first gate structure 120 may have a chamfered shape. For example, the first gate structure 120 may have a portion in which a width of the first gate structure 120 gradually decreases from the first width W1 to the second width W2 as it goes from the first portion 120a to the second portion 120b of the first gate structure 120.

Hereinafter, the semiconductor device according to some embodiments of the technical idea of the present inventive concepts will be described with reference to FIG. 10. For the sake of clarity of explanation, repeated parts of above description will be simplified or omitted.

Figure 10:
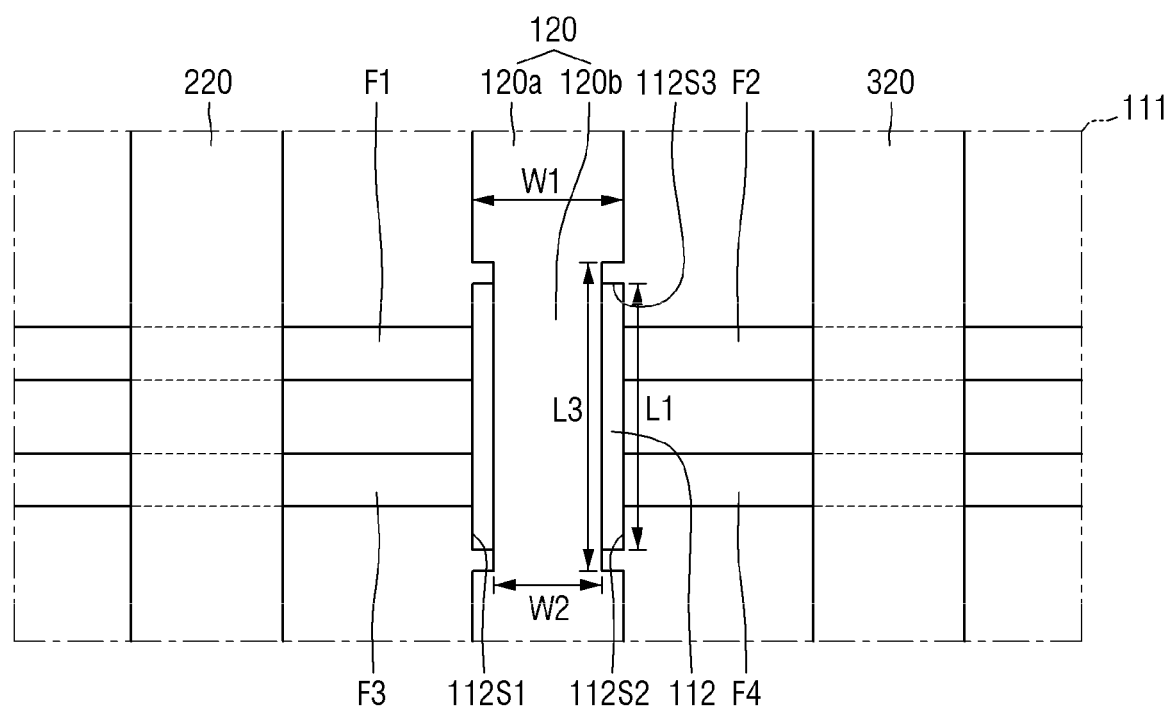

FIG. 10 is a layout diagram for explaining the semiconductor device according to some embodiments of the technical idea of the present inventive concepts. FIG. 10 is a diagram illustrating the configuration in which the first, second, and third gate structures 120, 220, and 320 are disposed in the layout diagram of FIG. 1. In FIG. 10, the first and second gate electrode layers MG1 and MG2 and the gate insulating film are not illustrated for clarity of illustration.

Referring to FIG. 10, the second portion 120b of the first gate structure 120 further includes a portion that does not overlap the second field insulating film 112 in the third direction X3.

For example, the length L3 of the second portion 120b of the first gate structure 120 may be longer than the length L1 of the second field insulating film 112. In other words, the length L3 of the portion having the second width W2 in the first gate structure 120 may be longer than the length L1 of the second field insulating film 112.

The first portion 120a of the first gate structure 120 may be disposed on the first field insulating film 111 to be spaced apart from the second field insulating film 112. For example, the first portion 120a of the first gate structure 120 may not be in contact with the third sidewall 112S3 of the second field insulating film 112.

The semiconductor device according to some embodiments of the technical idea of the present inventive concepts will be described below with reference to FIGS. 11 and 12. For the sake of clarity of explanation, repeated parts of above description will be simplified or omitted.

Figure 11:
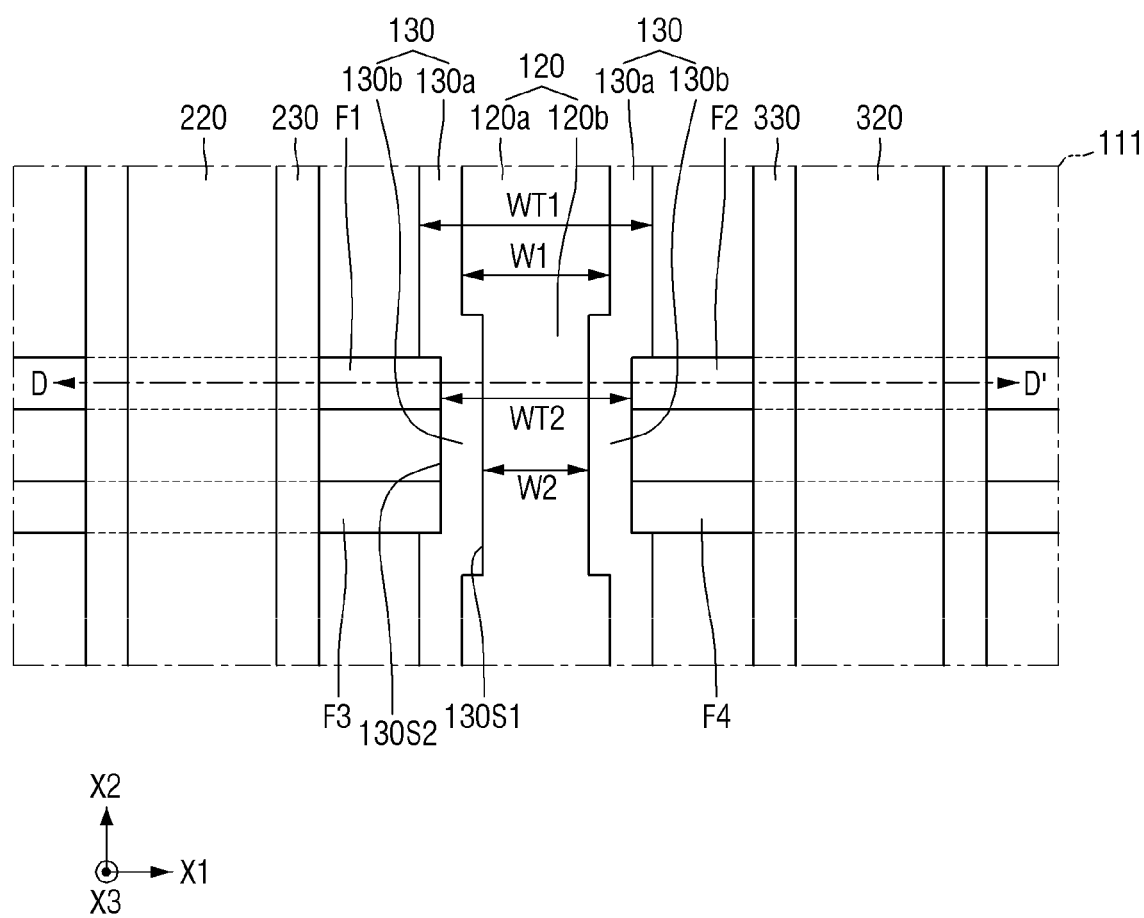

FIG. 11 is a layout diagram for explaining the semiconductor device according to some embodiments of the technical idea of the present inventive concepts. FIG. 12 is a cross-sectional view taken along the line D-D' of FIG. 11. FIG. 11 is a diagram illustrating the configuration in which the first, second, and third gate structures 120, 220, and 320 are disposed in the layout diagram of FIG. 1. In FIG. 11, the first and second gate electrode layers MG1 and MG2 and the gate insulating film are not illustrated for clarity of illustration.

Figure 12:
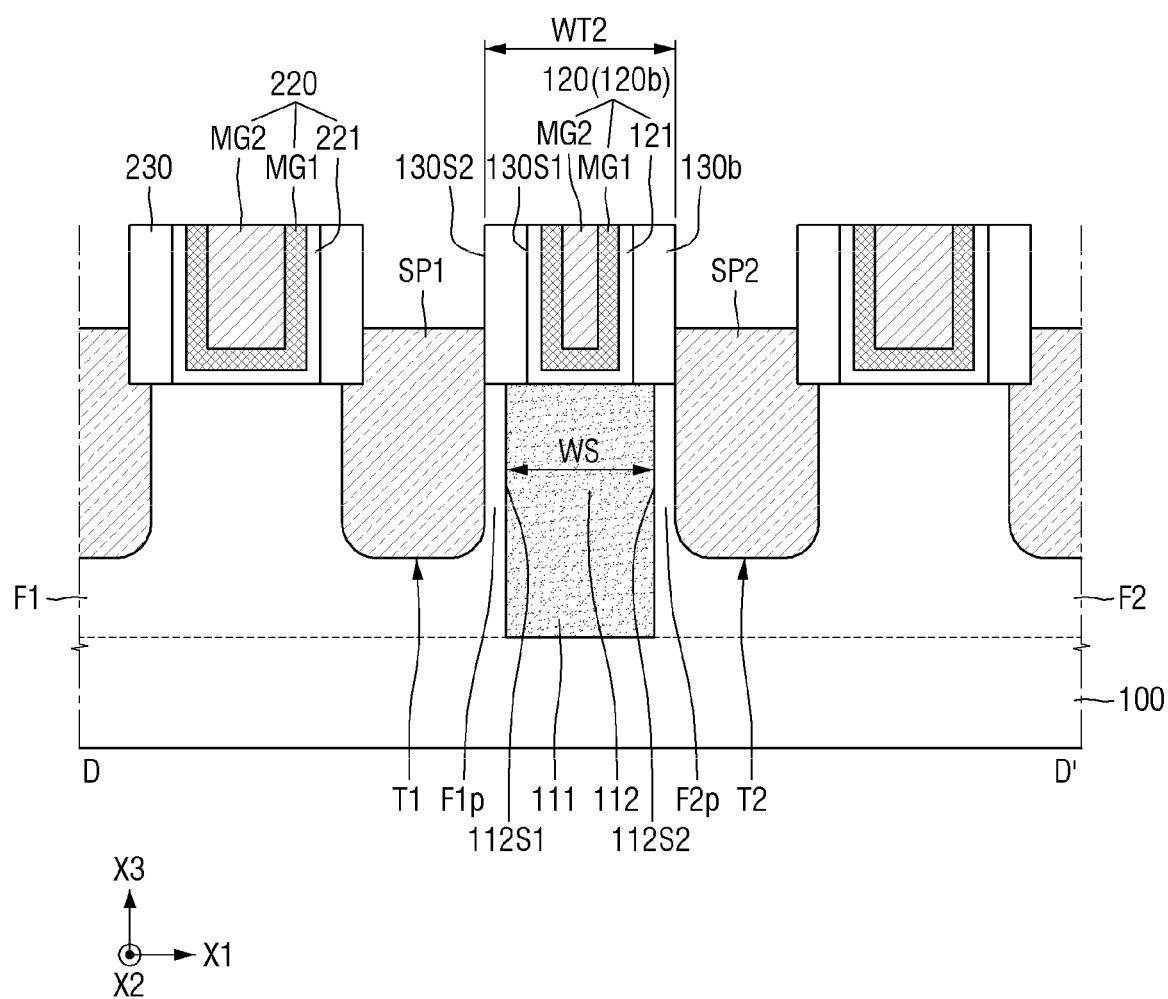
FIGS. 12 and 13 are cross-sectional views taken along line D-D' of FIG. 11.

Referring to FIGS. 11 and 12, a first gate spacer 130 may be disposed on both sidewalls of the first gate structure 120. A second gate spacer 230 may be disposed on both sidewalls of the second gate structure 220.

The first gate spacer 130 may extend in the second direction X2 along both sidewalls of the first gate structure 120. The first gate spacer 130 may be disposed, for example, on the first field insulating film 111, on the second field insulating film 112, on a part F1p of the first fin type pattern F1, and on a part F2p of the second fin type pattern F2.

The first gate spacer 130 may include a first spacer part 130a and a second spacer part 130b. The first spacer part 130a may include a portion disposed on the first field insulating film 111 along both sidewalls of the first portion 120a of the first gate structure 120. The second spacer part 130b may include a portion disposed on the second field insulating film 112 along both sidewalls of the second portion 120b of the first gate structure 120.

A sum total WT1 of the first width W1 of the first portion 120a of the first gate structure 120 and the width of the first spacer part 130 may be greater than a sum total WT2 of the second width W2 of the second portion 120b of the first gate structure 120 and the width of the second spacer part 130b.

The second spacer part 130b may include an inner sidewall 130S1 and an outer sidewall 130S2 facing each other. The inner sidewall 130S1 of the second spacer part 130b may be in contact with one sidewall of the second portion 120b of the first gate structure 120. The inner sidewall 130S1 of the second spacer part 130b may be located on the second field insulating film 112.

In some embodiments, the outer sidewall 130S2 of the second spacer part 130b may be located on the first fin type pattern F1. Therefore, the width WS of the second field insulating film 112 may be smaller than the sum total WT2 of the second width W2 of the second portion 120b of the first gate structure 120 and the width of the second spacer part 130b. In some embodiments, the first gate structure 120 may be formed by a gate last process or a replacement gate process.

The first gate insulating film 121 may include a portion extending along the inner sidewall 130S1 of the second spacer part 130b.

In the drawings, the first gate spacer 130 is illustrated as having a single film structure, but the present inventive concepts are not limited thereto. For example, the first gate spacer 130 may have a multi-film structure.

The first gate spacer 130 may include, for example, silicon nitride (SiN), silicon oxynitride (SiON), silicon oxide (SiO$_2$), silicon carbonitride (SiOCN), silicon carbonitride (SiCN), and combinations thereof.

Each of the first and second trenches T1 and T2 may be formed in each of the first and second fin type patterns F1 and F2. The other sidewall of the first trench T1 may be defined by a part F1p of the first fin type pattern F1. The one sidewall of the second trench T2 may be defined by a part F2p of the second fin type pattern F2. The respective bottom surfaces of the first and second trenches T1 and T2 may be defined by each of the first and second fin type patterns F1 and F2.

Each of the first and second semiconductor patterns SP1 and SP2 may fill the respective first and second trenches T1 and T2. Each of the first and second semiconductor patterns SP1 and SP2 may be formed, for example, to a position higher than the upper surfaces of each of the first and second fin type patterns F1 and F2.

A part F1p of the first fin type pattern F1 may be located between the first semiconductor pattern SP1 and the second field insulating film 112. A part of the second fin type pattern F2 may be located between the second semiconductor pattern SP2 and the second field insulating film 112.

The semiconductor device according to some embodiments of the technical idea of the present inventive concepts will be described below with reference to FIGS. 11 and 13. For the sake of clarity of explanation, repeated parts of above description will be simplified or omitted.

Figure 13:
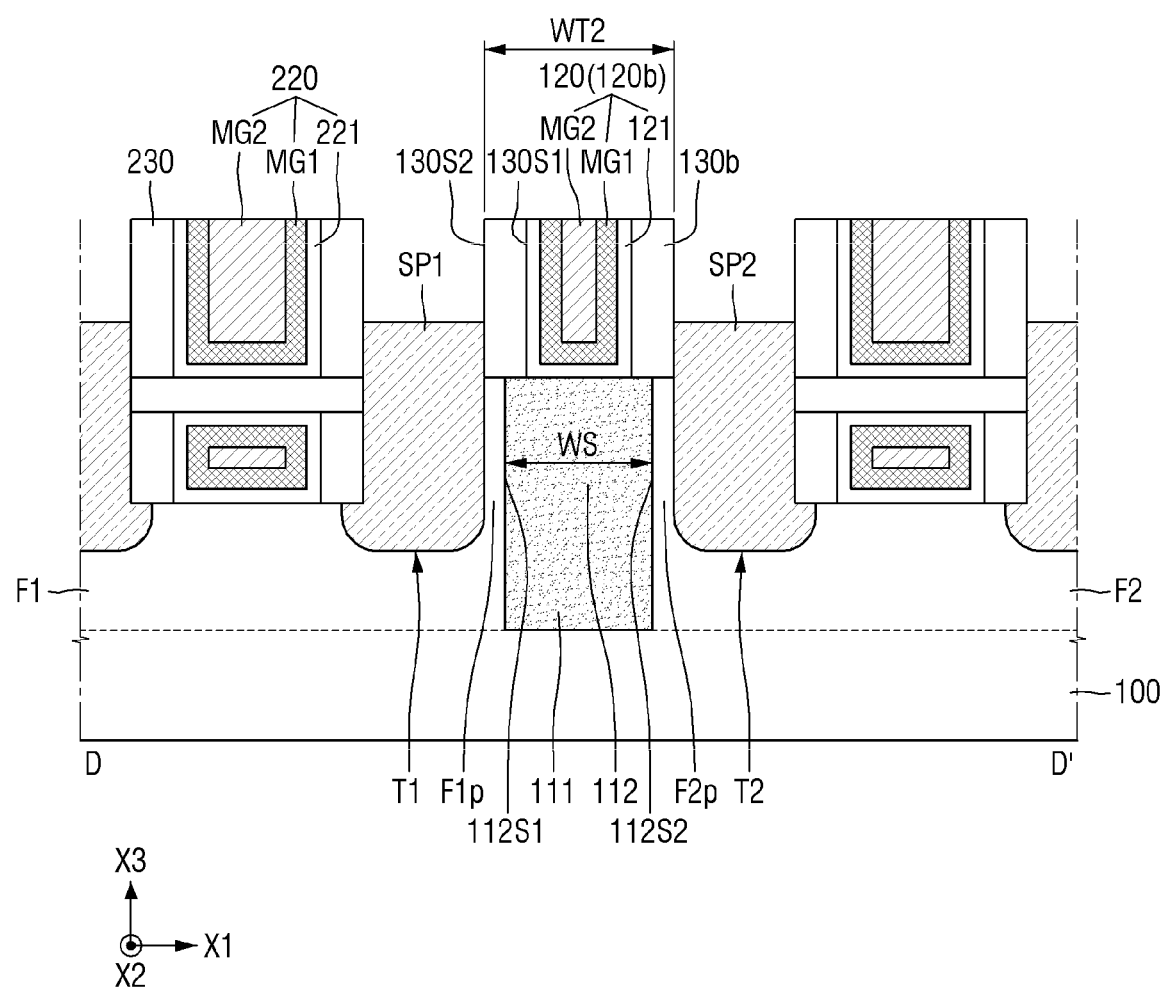

FIG. 13 is a cross-sectional view taken along the line D-D' of FIG. 11.

Referring to FIGS. 11 and 13, the second gate structure 220 and the second gate spacer 230 may wrap the first wire pattern F1w. The second gate insulating film 221, the first gate electrode layer MG1 and the second gate electrode layer MG2 may wrap the first wire pattern F1w.

The first wire pattern F1w may be a part of the first fin type pattern F1. The first wire pattern F1w may pass through the second gate structure 220 and the second gate spacer 230.

Hereinafter, the semiconductor device according to some embodiments of the technical idea of the present inventive concepts will be described with reference to FIGS. 14 and 15. For the sake of clarity of explanation, repeated parts of above description will be simplified or omitted.

Figure 14:
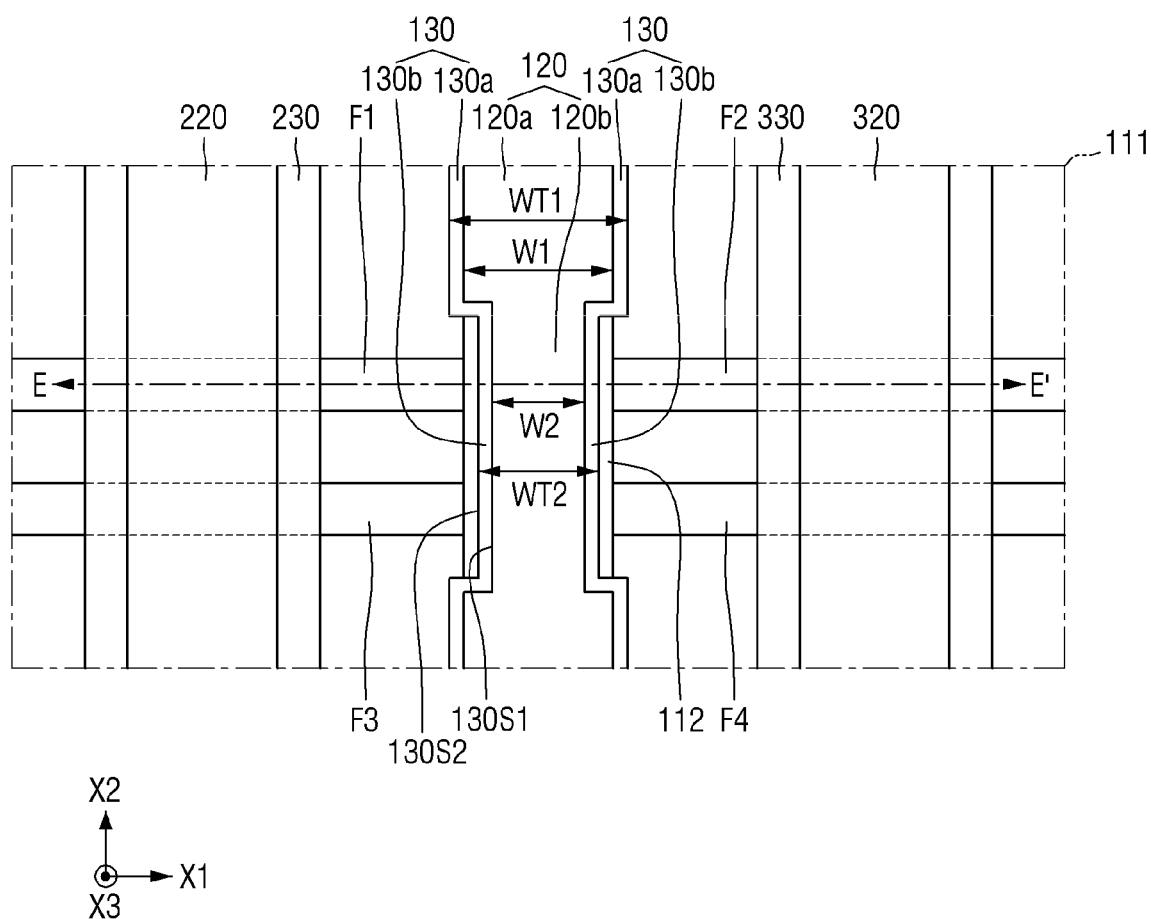
FIG. 14 is a layout diagram for explaining the semiconductor device according to some embodiments of the technical idea of the present inventive concepts.

FIG. 14 is a layout diagram for explaining the semiconductor device according to some embodiments of the technical idea of the present inventive concepts. FIG. 15 is a cross-sectional view taken along the line E-E' of FIG. 11. FIG. 14 is a diagram illustrating the configuration in which the first, second, and third gate structures 120, 220, and 320 are disposed in the layout diagram of FIG. 1. In FIG. 14, for clarity of illustration, the first and second gate electrode layers MG1 and MG2 and the gate insulating film are not illustrated.

Figure 15:
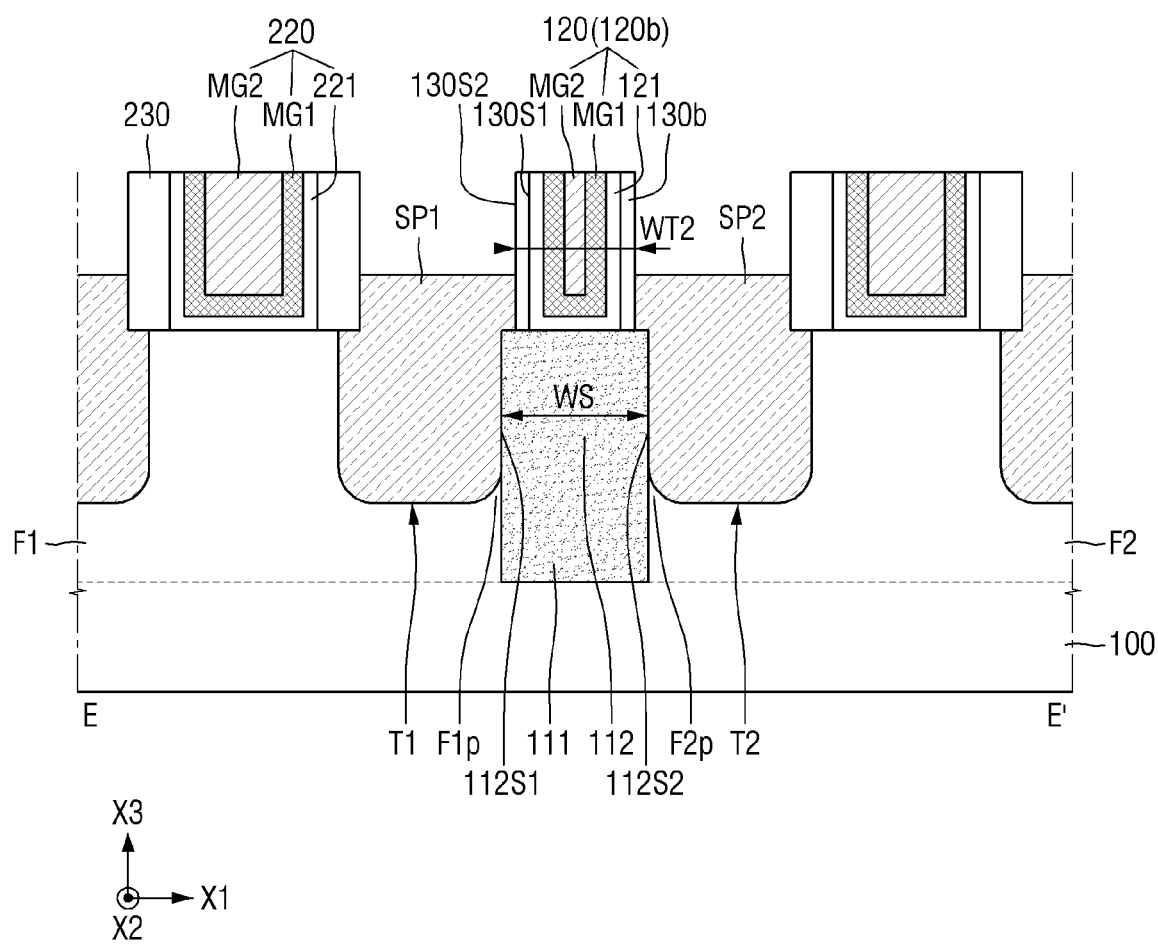
FIG. 15 is a cross-sectional view taken along the line E-E' of FIG. 11.

Referring to FIGS. 14 and 15, the outer sidewall 130S2 of the second spacer part 130b may be located on the second field insulating film 112.

In some embodiments, the sum total WT2 of the second width W2 of the second portion 120b of the first gate structure 120 and the width of the second spacer part 130b may be smaller than the width WS of the second field insulating film 112.

On the other hand, the sum total WT2 of the second width W2 of the second portion 120b of the gate structure 120 and the width of the second spacer part 130b is illustrated as being smaller than the width WS of the second field insulating film 112, but the inventive concepts are not limited thereto. For example, the sum total WT2 of the second width W2 of the second portion 120b of the first gate structure 120 and the width of the second spacer part 130b may be the same as the width WS of the second field insulating film 112.

Hereinafter, the semiconductor device according to some embodiments of the technical idea of the present inventive concepts will be described with reference to FIGS. 16 and 17. For the sake of clarity of explanation, repeated parts of above description will be simplified or omitted.

Figure 16:
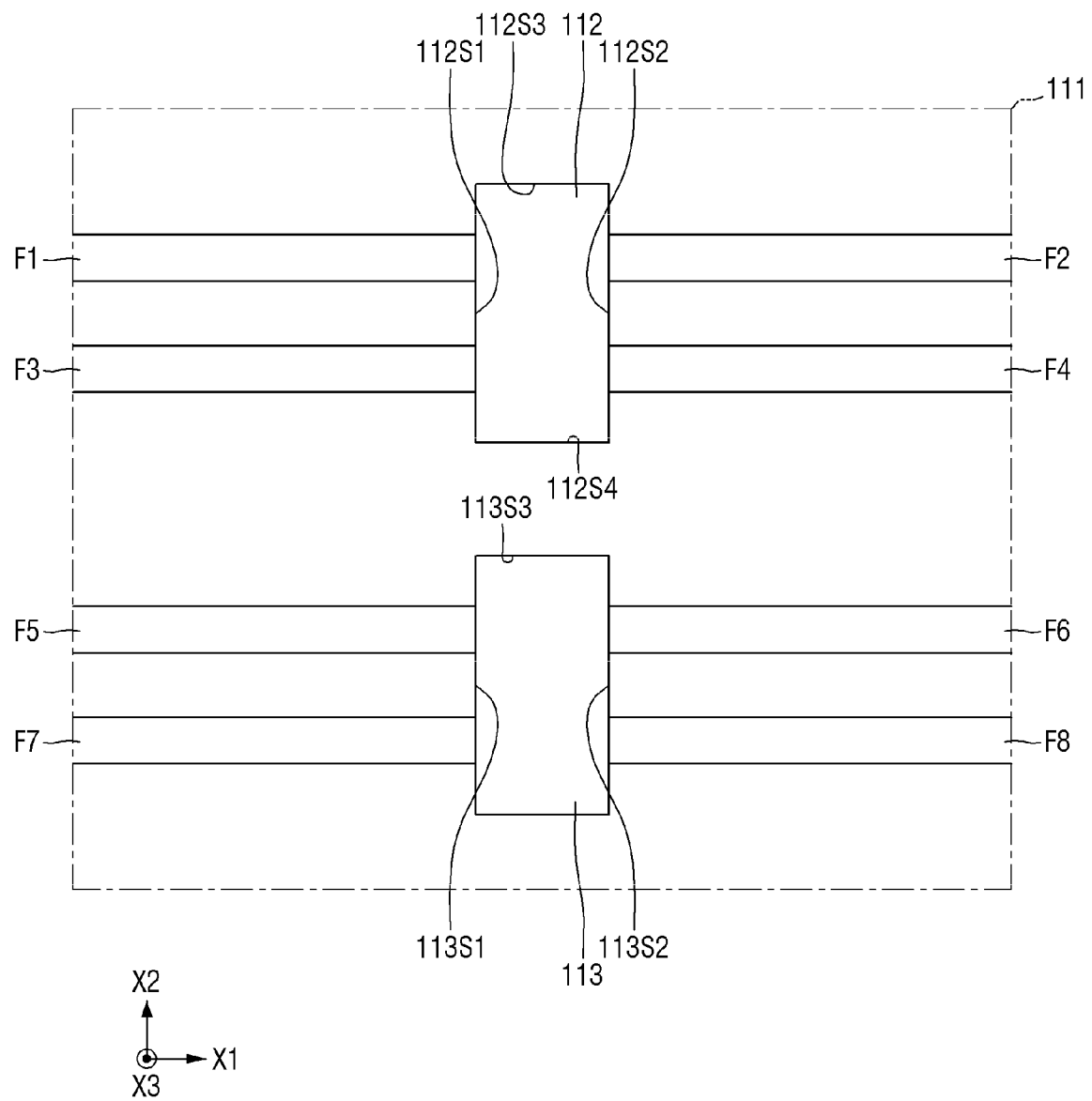
FIGS. 16, 17, 18, 19, 20, 21, and 22 are layout diagrams for explaining the semiconductor device according to some embodiments of the technical idea of the present inventive concepts.
Figure 17:
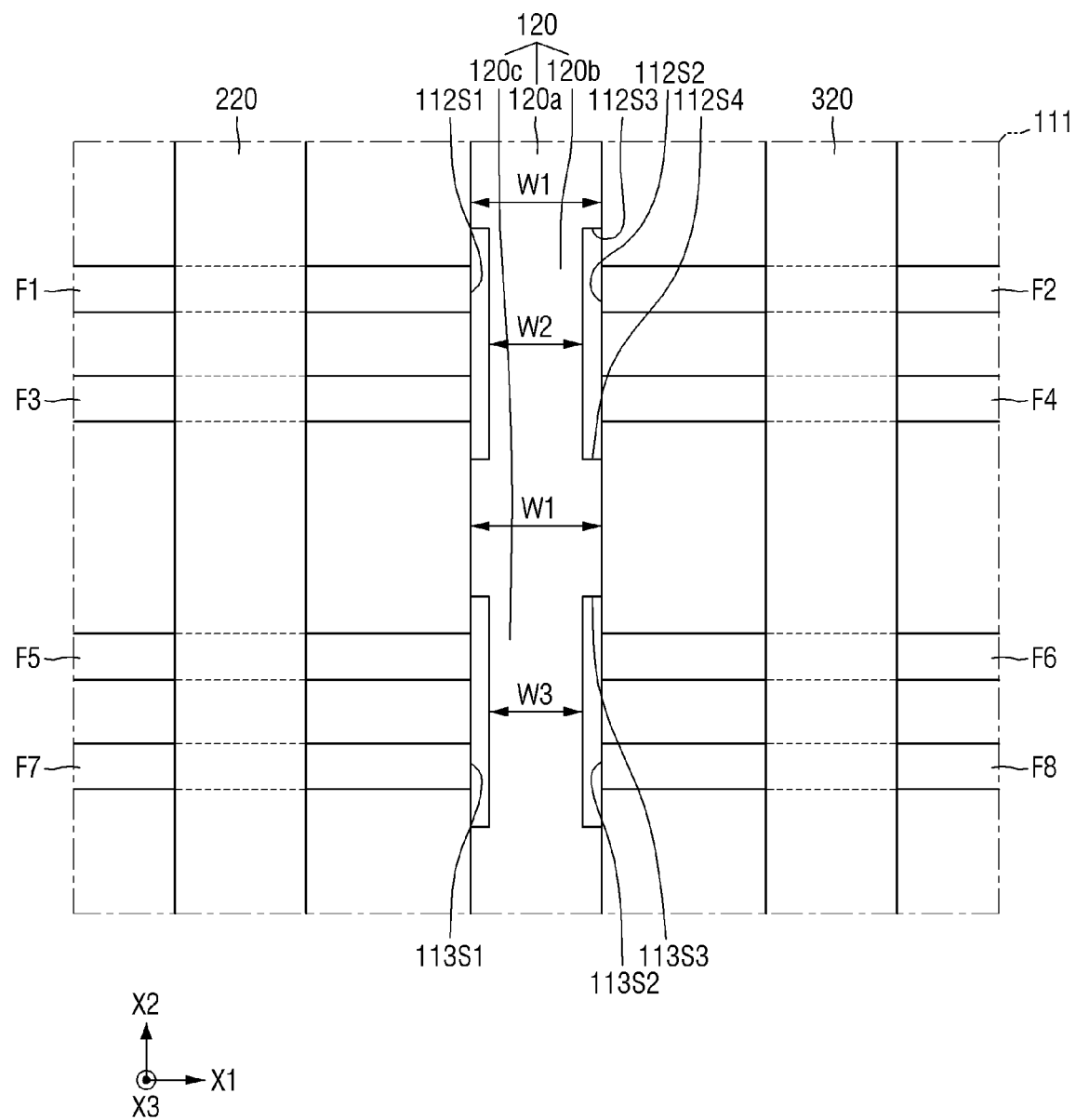

FIGS. 16 and 17 are layout diagrams for explaining the semiconductor device according to some embodiments of the technical idea of the present inventive concepts. FIG. 17 is a diagram illustrating the configuration in which the first, second, and third gate structures 120, 220, and 320 are disposed in the layout diagram of FIG. 16. In FIG. 17, the first and second gate electrode layers MG1 and MG2 and the gate insulating film are not illustrated for clarity of illustration.

Referring to FIG. 16, the semiconductor device according to some embodiments of the technical idea of the present inventive concepts may further include a third field insulating film 113 spaced apart from the second field insulating film 112 in the second direction X2.

Each of the fifth, sixth, seventh and eighth fin type patterns F5, F6, F7, and F8 may extend in the first direction X1. The fifth fin type pattern F5 and the sixth fin type pattern F6 may be spaced apart from each other in the first direction X1. The seventh fin type pattern F7 and the eighth fin type pattern F8 may be spaced apart from each other in the first direction X1. The fifth fin type pattern F5 and the seventh fin type pattern F7 may be spaced apart from each other in the second direction X2. The sixth fin type pattern F6 and the eighth fin type pattern F8 may be spaced apart from each other in the second direction X2. Each of the fifth, sixth, seventh and eighth fin type patterns F5, F6, F7, and F8 may protrude from the first field insulating film 111.

The third field insulating film 113 may be disposed between the fifth fin type pattern F5 and the sixth fin type pattern F6, and between the seventh fin type pattern F7 and the eighth fin type pattern F8. The third field insulating film 113 may be disposed on the first field insulating film 111. The third field insulating film 113 may protrude from the first field insulating film 111. For example, the third field insulating film 113 may protrude from the upper surface of the first field insulating film 111 in the third direction X3. The third field insulating film 113 may extend in the second direction X2, between the fifth fin type pattern F5 and the sixth fin type pattern F6, and between the seventh fin type pattern F7 and the eighth fin type pattern F8.

The fourth sidewall 112S4 of the second field insulating film 112 may extend in the first direction X1 to face the third sidewall 112S3 of the second field insulating film 112. The fourth sidewall 112S4 of the second field insulating film 112 may connect the first sidewall 112S1 and the second sidewall 112S2.

The third field insulating film 113 may include a first sidewall 113S1 being in contact with the other sidewall of the fifth and seventh fin type patterns F5 and F7, and a second sidewall 113S2 being in contact with one sidewall of the sixth and eighth fin type pattern F6 and F8. The first sidewall 113S1 and the second sidewall 113S2 of the third field insulating film 113 may extend in the second direction X2 to face each other. The third sidewall 113S3 of the third field insulating film 113 may extend in the first direction X1 and may connect the first sidewall 113S1 and the second sidewall 113S2 of the third field insulating film 113.

In the drawings, the second field insulating film 112 and the third field insulating film 113 are illustrated as separate insulating films, but the technical idea of the present inventive concepts is not limited thereto. For example, it is a matter of course that the second field insulating film 112 and the third field insulating film 113 may be one connected to each other. In this case, the fourth sidewall 112S4 facing the third sidewall 112S3 of the second field insulating film 112, and the third sidewall 113S3 of the third field insulating film 113 may be in contact with each other.

Referring to FIG. 17, the first gate structure 120 may further include a third portion 120c.

The first portion 120a of the first gate structure 120 may be a portion that does not overlap the third field insulating film 113 in the third direction X3. In some embodiments, the first portion 120a of the first gate structure 120 may be a portion which is not disposed between the fifth fin type pattern F5 and the sixth fin type pattern F6, and between the seventh fin type pattern F7 and the eighth fin type pattern F8. The first portion 120a of the first gate structure 120 may be in contact with the third sidewall 113S3 of the third field insulating film 113.

The third portion 120c of the first gate structure 120 may be a portion on the third field insulating film 113. The third portion 120c of the first gate structure 120 may be a portion which overlaps the third field insulating film 113 in the third direction X3. In some embodiments, the third portion 120c of the first gate structure 120 may be a portion which is disposed between the fifth fin type pattern F5 and the sixth fin type pattern F6, and between the seventh fin type pattern F7 and the eighth fin type pattern F8. The third portion 120c of the first gate structure 120 may be a portion having a third width W3.

The first gate structure 120 and the third field insulating film 113 may constitute a single diffusion break.

The first width W1 of the first portion 120a of the first gate structure 120 may be larger than the third width W3 of the third portion 120c of the first gate structure 120.

The second width W2 of the second portion 120b of the first gate structure 120 may be the same as the third width W3 of the third portion 120c of the first gate structure 120, but the inventive concepts are not limited thereto. For example, the second width W2 of the second portion 120b of the first gate structure 120 may, of course, be different from the third width W3 of the third portion 120c of the first gate structure 120.

The second gate structure 220 may be disposed on the fifth and seventh fin type patterns F5 and F7. The third gate structure 320 may be disposed on the sixth and eighth fin type patterns F6 and F8.

Hereinafter, the semiconductor device according to some embodiments of the technical idea of the present inventive concepts will be described with reference to FIGS. 16 and 18. For the sake of clarity of explanation, repeated parts of above description will be simplified or omitted.

Figure 18:
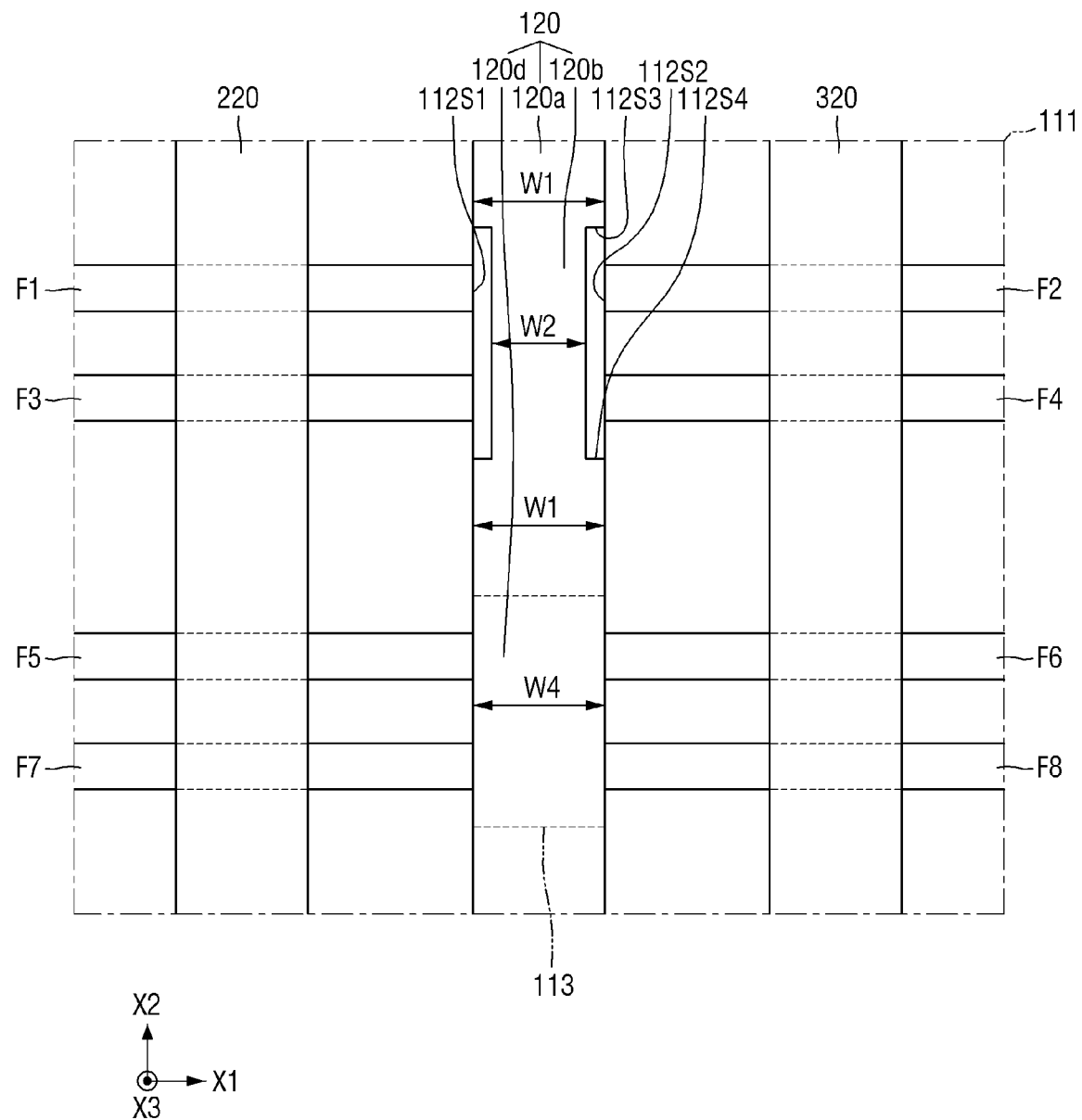

FIG. 18 is a layout diagram for explaining the semiconductor device according to some embodiments of the technical idea of the present inventive concepts. FIG. 18 is a diagram illustrating the configuration in which the first, second, and third gate structures 120, 220, and 320 are disposed in the layout diagram of FIG. 16. In FIG. 18, the first and second gate electrode layers MG1 and MG2 and the gate insulating film are not illustrated for clarity of illustration.

Referring to FIGS. 16 and 18, the first gate structure 120 may include a fourth portion 120d having a fourth width W4.

The fourth portion 120d of the first gate structure 120 may be a portion on the third field insulating film 113. The fourth portion 120d of the first gate structure 120 may be a portion which overlaps the third field insulating film 113 in the third direction X3. In some embodiments, the fourth portion 120d of the first gate structure 120 may be a portion which is disposed located between the fifth fin type pattern F5 and the sixth fin type pattern F6, and between the seventh fin type pattern F7 and the eighth fin type pattern F8. The fourth portion 120d of the first gate structure 120 may be a portion having the fourth width W4.

The fourth width W4 of the fourth portion 120d of the first gate structure 120 may be greater than the second width W2 of the second portion 120b of the first gate structure 120.

In some embodiments, the first width W1 of the first portion 120a of the first gate structure 120 may be the same as the fourth width W4 of the fourth portion 120d of the first gate structure 120.

In some embodiments, the first width W1 of the first portion 120a of the first gate structure 120 may be different from the fourth width W4 of the fourth portion 120d of the first gate structure 120. However, even in this case, the fourth width W4 of the fourth portion 120d of the first gate structure 120 may be greater than the second width W2 of the second portion 120b of the first gate structure 120.

Hereinafter, the semiconductor device according to some embodiments of the technical idea of the present inventive concepts will be described with reference to FIGS. 16 and 19. For the sake of clarity of explanation, repeated parts of above description will be simplified or omitted.

Figure 19:
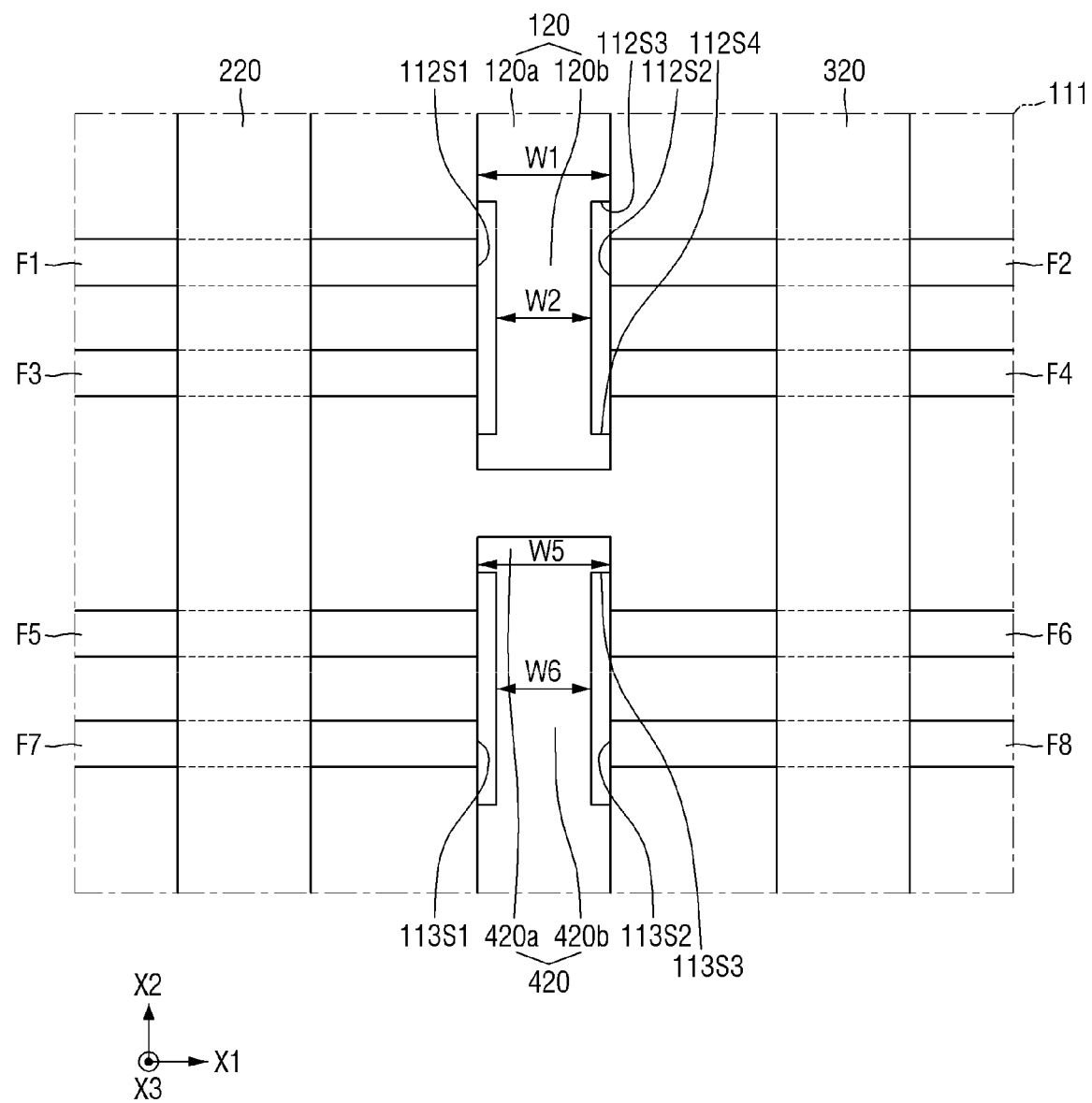

FIG. 19 is a layout diagram for explaining the semiconductor device according to some embodiments of the technical idea of the present inventive concepts. FIG. 19 is a view illustrating that the first, second, and third gate structures 120, 220, and 320 are disposed in the layout diagram of FIG. 16. In FIG. 19, the first and second gate electrode layers MG1 and MG2 and the gate insulating film are not illustrated for clarity of illustration.

Referring to FIGS. 16 and 19, the semiconductor device according to some embodiments of the technical idea of the present inventive concepts may further include a fourth gate structure 420 spaced apart from the first gate structure 120 in the second direction X2.

The fourth gate structure 420 may be disposed on the first and third field insulating films 111 and 113. The fourth gate structure 420 may extend over the first and third field insulating films 111 and 113 in the second direction X2. The fourth gate structure 420 may extend in the second direction X2, between the fifth fin type pattern F5 and the sixth fin type pattern F6, and between the seventh fin type pattern F7 and the eighth fin type pattern F8.

The first portion 420a of the fourth gate structure 420 may be a portion on the first field insulating film 111. The first portion 420a of the fourth gate structure 420 may be a portion which does not overlap the third field insulating film 113 in the third direction X3. In some embodiments, the first portion 420a of the fourth gate structure 420 may be a portion which is not disposed between the fifth fin type pattern F5 and the sixth fin type pattern F6, and between the seventh fin type pattern F7 and the eighth fin type pattern F8. The first portion 420a of the fourth gate structure 420 may be in contact with the third sidewall 113S3 of the third field insulating film 113. The first portion 420a of the fourth gate structure 420 may be a portion having a fifth width W5.

The second portion 420b of the fourth gate structure 420 may be a portion on the third field insulating film 113. The second portion 420b of the fourth gate structure 420 may be a portion which overlaps the third field insulating film 113 in the third direction X3. In some embodiments, the second portion 420b of the fourth gate structure 420 may be a portion disposed between the fifth fin type pattern F5 and the sixth fin type pattern F6, and between the seventh fin type pattern F7 and the eighth fin type pattern F8. The second portion 420b of the fourth gate structure 420 may be a portion having a sixth width W6.

The fourth gate structure 420 and the third field insulating film 113 may constitute a single diffusion break.

The fifth width W5 of the first portion 420a of the fourth gate structure 420 may be greater than the sixth width W6 of the second portion 420b of the fourth gate structure 420.

The width of the third field insulating film 113 may be greater than the sixth width W6 of the second portion 420b of the fourth gate structure 420. However, the technical idea of the present inventive concepts is not limited thereto. For example, the width of the third field insulating film 113 may be the same as the sixth width W6 of the second portion 420b of the fourth gate structure 420.

In the drawings, the fifth width W5 of the first portion 420a of the fourth gate structure 420 and the width of the third field insulating film 113 are illustrated as being substantially the same, but the technical idea of the present inventive concepts is not limited thereto. For example, the fifth width W5 of the first portion 420a of the fourth gate structure 420 may be, of course, different from the width of the third field insulating film 113.

Hereinafter, the semiconductor device according to some embodiments of the technical idea of the present inventive concepts will be described with reference to FIGS. 16 and 20. For the sake of clarity of explanation, repeated parts of above description will be simplified or omitted.

Figure 20:
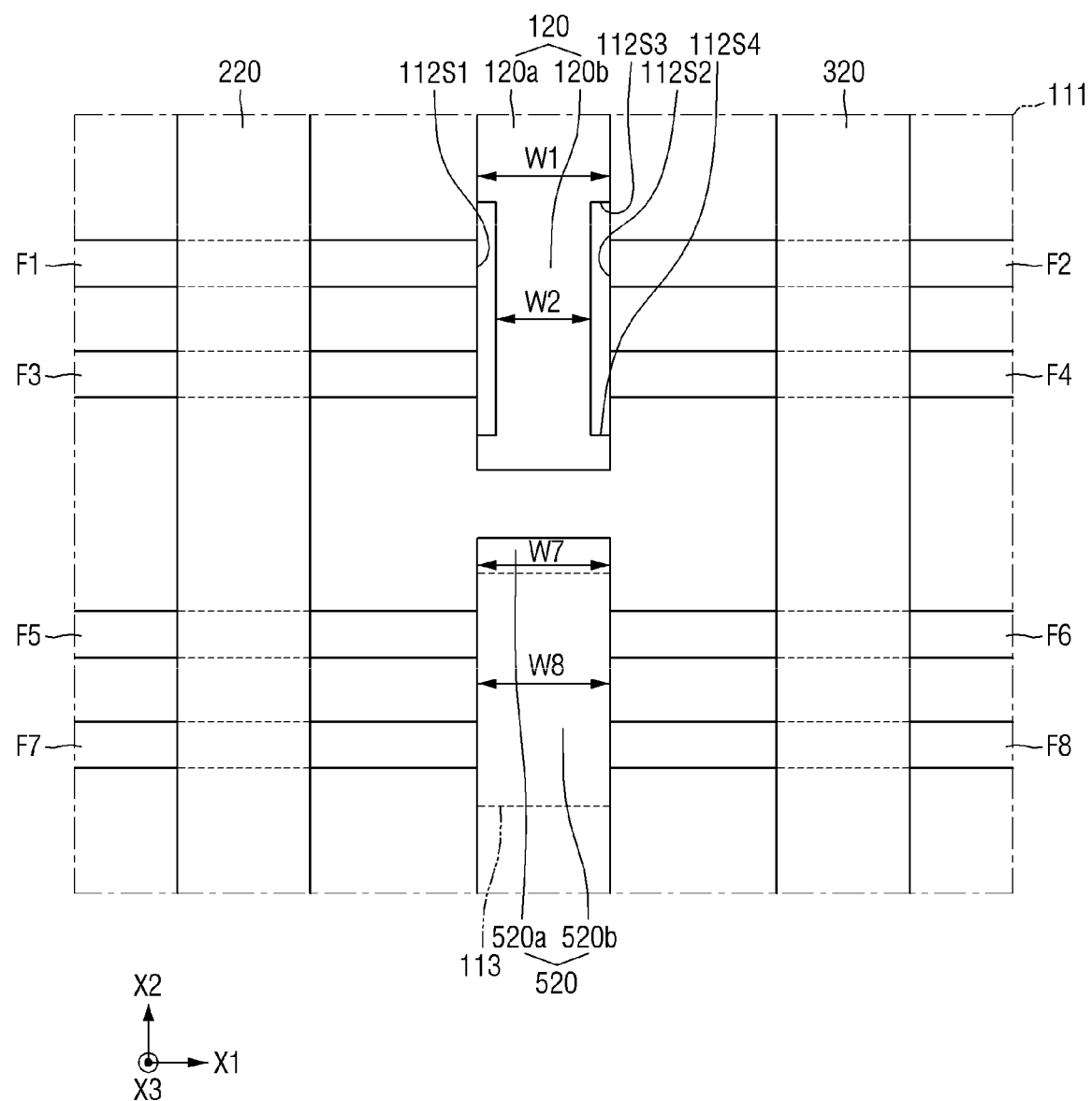

FIG. 20 is a layout diagram for explaining the semiconductor device according to some embodiments of the technical idea of the present inventive concepts. FIG. 20 is a diagram illustrating the configuration in which the first, second, and third gate structures 120, 220, and 320 are disposed in the layout diagram of FIG. 16. In FIG. 20, the first and second gate electrode layers MG1 and MG2 and the gate insulating film are not illustrated for clarity of illustration.

Referring to FIGS. 16 and 20, the semiconductor device according to some embodiments of the technical idea of the present inventive concepts may further include a fifth gate structure 520 spaced apart from the first gate structure 120 in the second direction X2.

The fifth gate structure 520 may be disposed on the first and third field insulating films 111 and 113. The fifth gate structure 520 may extend over the first and third field insulating films 111 and 113 in the second direction X2. The fifth gate structure 520 may extend in the second direction X2, between the fifth fin type pattern F5 and the sixth fin type pattern F6, and between the seventh fin type pattern F7 and the eighth fin type pattern F8.

A first portion 520a of the fifth gate structure 520 may be a portion on the first field insulating film 111. The first portion 520a of the fifth gate structure 520 may be a portion which does not overlap the third field insulating film 113 in the third direction X3. In some embodiments, the first portion 520a of the fifth gate structure 520 may be a portion which is not disposed between the fifth fin type pattern F5 and the sixth fin type pattern F6, and between the seventh fin type pattern F7 and the eighth fin type pattern F8. The first portion 520a of the fifth gate structure 520 may be a portion having a seventh width W7.

A second portion 520b of the fifth gate structure 520 may be a portion on the third field insulating film 113. The second portion 520b of the fifth gate structure 520 may be a portion which overlaps the third field insulating film 113 in the third direction X3. In some embodiments, the second portion 520b of the fifth gate structure 520 may be a portion disposed between the fifth fin type pattern F5 and the sixth fin type pattern F6, and between the seventh fin type pattern F7 and the eighth fin type pattern F8. The second portion 520b of the fifth gate structure 520 may be a portion having an eighth width W8.

The fifth gate structure 520 and the third field insulating film 113 may constitute a single diffusion break.

The eighth width W8 of the second portion 520b of the fifth gate structure 520 may be greater than the second width W2 of the second portion 120b of the first gate structure 120. The seventh width W7 of the first portion 520a of the fifth gate structure 520 may be the same as the eighth width W8 of the second portion 520b of the fifth gate structure 520.

The seventh width W7 of the first portion 520a of the fifth gate structure 520 may be the same as the first width W1 of the first portion 120a of the first gate structure 120, but the inventive concepts are not limited thereto. For example, the seventh width W7 of the first portion 520a of the fifth gate structure 520 may, of course, be different from the first width W1 of the first portion 120a of the first gate structure 120.

Hereinafter, the semiconductor device according to some embodiments of the technical idea of the present inventive concepts will be described with reference to FIGS. 21 to 25. For the sake of clarity of explanation, repeated parts of above description will be simplified or omitted.

Figure 21:
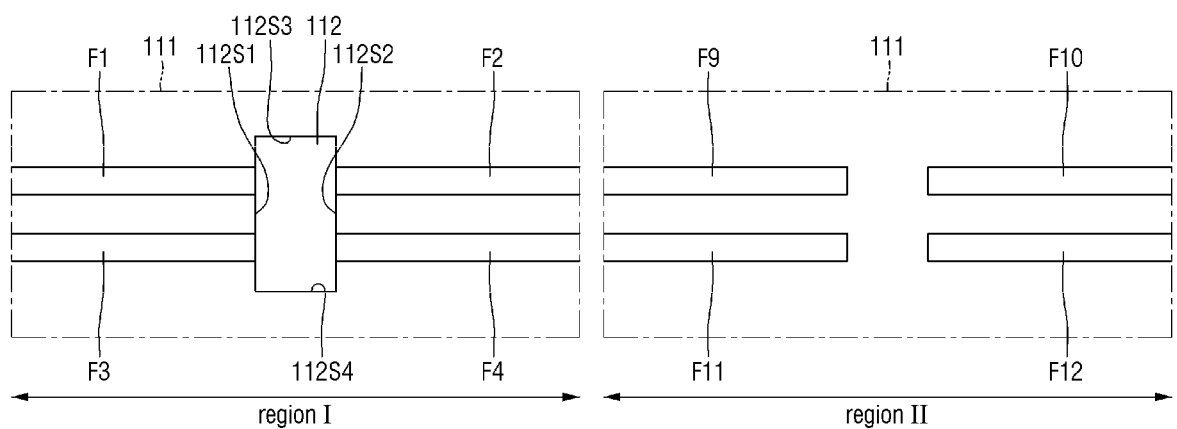

FIG. 21 is a layout diagram for explaining the semiconductor device according to some embodiments of the technical idea of the present inventive concepts.

Referring to FIG. 21, the substrate 100 may include a first region I and a second region II. The first region I and the second region II may be regions adjacent to each other, or they may be regions that are spaced apart from each other.

The first, second, third and fourth fin type pattern F1, F2, F3, and F4, the first field insulating film 111 and the second field insulating film 112 described referring to FIG. 1 may be disposed in the first region I of the substrate 100.

Ninth, tenth, eleventh, and twelfth fin type patterns F9, F10, F11, and F12, and the first field insulating film 111 may be disposed in the second region II of the substrate 100. The second region II of the substrate 100 may, for example, not include the field insulating films (for example, second and third field insulating films 112 and 113) protruding from the first field insulating film 111. The first field insulating film 111 may wrap some parts of the ninth, tenth, eleventh and twelfth fin type patterns F9, F10, F11, F12. The ninth and tenth fin type patterns F9 and F10 may be insulated by being spaced apart from each other by the first field insulating film 111. The eleventh and twelfth fin type patterns F11 and F12 may be insulated by being spaced apart from each other by the first field insulating film 111.

The description of the first, second, third and fourth fin type patterns F1, F2, F3, and F4 may be applied to the ninth, tenth, eleventh and twelfth fin type patterns F9, F10, F11, and F12.

In some embodiments, the first region I of the substrate 100 may be a region in which the PMOS transistor is formed, and the second region II may be a region in which an NMOS transistor is formed.

Figure 22:
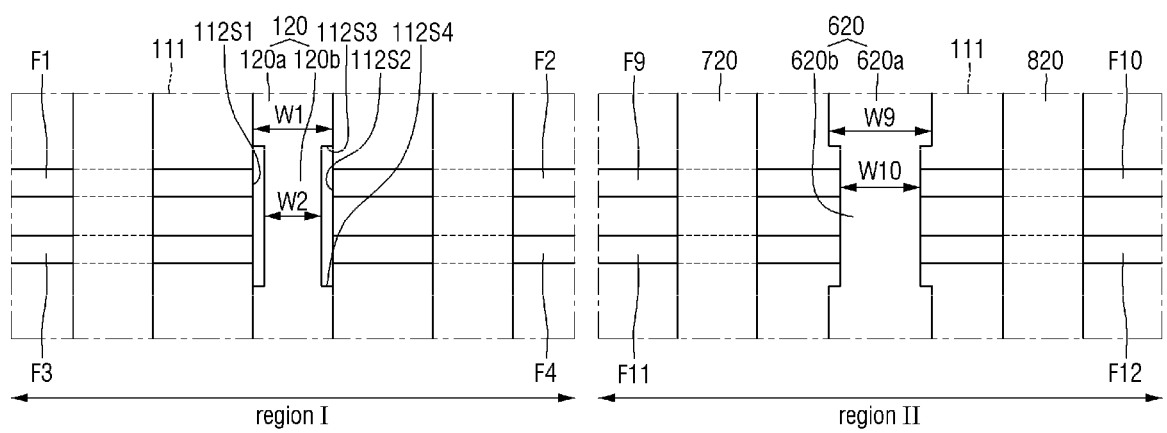
Figure 23:
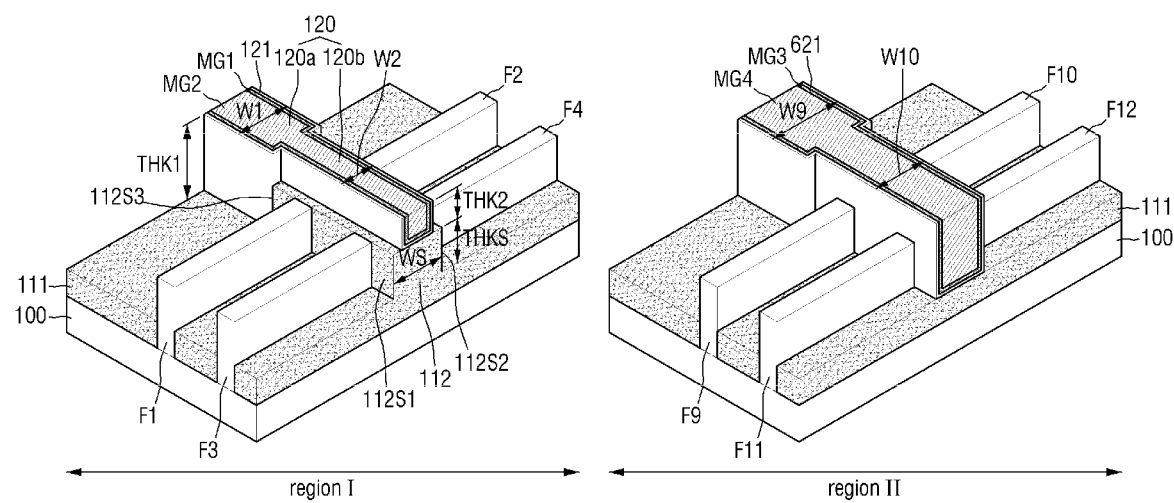
FIG. 23 is a perspective view for explaining the semiconductor device according to some embodiments of the technical idea of the present inventive concepts.

FIG. 22 is a layout diagram for explaining the semiconductor device according to some embodiments of the technical idea of the present inventive concepts. FIG. 22 is a diagram illustrating the configuration in which the sixth, seventh and eighth gate structures 620, 720, and 820 are disposed in the layout diagram of FIG. 21. In FIG. 22, the third and fourth gate electrode layers MG3 and MG4 and the gate insulating film are not illustrated for clarity of illustration. FIG. 23 is a perspective view for explaining the semiconductor device according to some embodiments of the technical idea of the present inventive concepts. In FIGS. 22 and 23, the gate spacer is not illustrated for clarity of illustration. FIG. 23 is a partial perspective view illustrating only a partial region of the layout diagram of FIG. 22 for clarity of illustration.

Referring to FIGS. 22 and 23, the sixth, seventh and eighth gate structures 620, 720, and 820 may be disposed in the second region II of the substrate 100. The first, second and third gate structures 120, 220, and 320 described referring to FIGS. 4a and 5 may be disposed in the first region I of the substrate 100.

The sixth gate structure 620 may be disposed on the first field insulating film 111. The sixth gate structure 620 may be disposed to intersect with the ninth, tenth, eleventh and twelfth fin type patterns F9, F10, F11, and F12. The sixth gate structure 620 may be disposed between the ninth fin type pattern F9 and the tenth fin type pattern F10, and between the eleventh fin type pattern F11 and the twelfth fin type pattern F12.

The sixth gate structure 620 may include a first portion 620a and a second portion 620b. The first portion 620a of the sixth gate structure 620 may be a portion having a ninth width W9. The second portion 620b of the sixth gate structure 620 may be a portion having a tenth width W10 smaller than the ninth width W9. The second portion 620b of the sixth gate structure 620 may be a portion which is disposed between the ninth fin type pattern F9 and the tenth fin type pattern F10, and between the eleventh fin type pattern F11 and the twelfth fin type pattern F12. The first portion 620a of the sixth gate structure 620 may be a portion which is not disposed between the ninth fin type pattern F9 and the tenth fin type pattern F10, and between the eleventh fin type pattern F11 and the twelfth fin type pattern F12. The seventh gate structure 720 may be disposed on the first field insulating film 111, the ninth fin type pattern F9 and the eleventh fin type pattern F11. The eighth gate structure 820 may be disposed on the first field insulating film 111, the tenth fin type pattern F10 and the twelfth fin type pattern F12.

The sixth gate structure 620 may include a sixth gate insulating film 621, a third gate electrode layer MG3, and a fourth gate electrode layer MG4. The description of the first gate insulating film 121 described referring to FIGS. 5 to 8 may also be applied to the sixth gate insulating film 621.

The third gate electrode layer MG3 may be disposed on the sixth gate insulating film 621 along the profile of the sixth gate insulating film 621. The fourth gate electrode layer MG4 may be disposed on the third gate electrode layer MG3. The third and fourth gate electrode layers MG3 and MG4 may have a structure, for example, different from the first and second gate electrode layers MG1 and MG2, or may contain different materials. Alternatively, the third and fourth gate electrode layers MG3 and MG4 may have the same structure as the first and second gate electrode layers MG1 and MG2, for example, or may contain the different materials.

Figure 24:
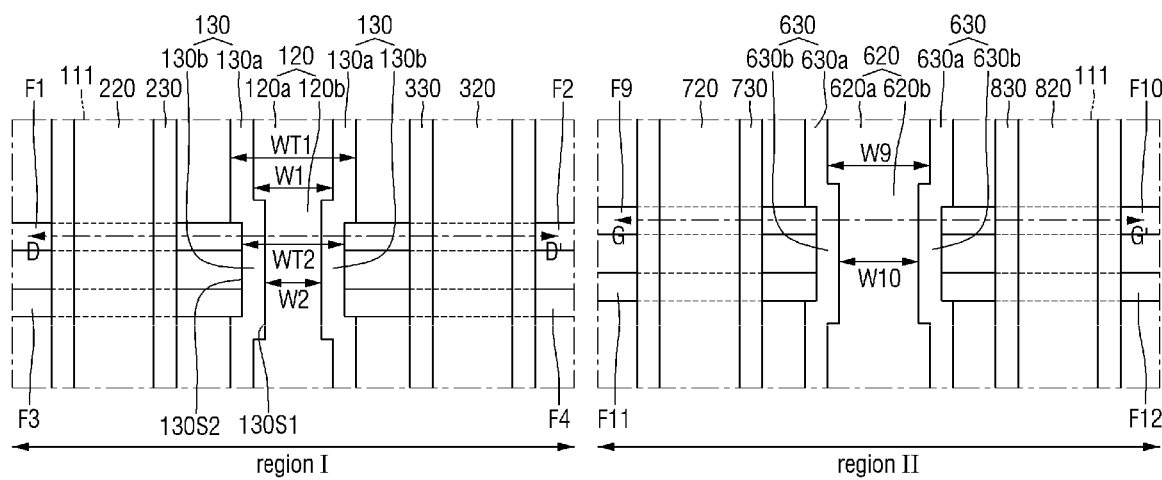
FIG. 24 is a layout diagram for explaining the semiconductor device according to some embodiments of the technical idea of the present inventive concepts.
Figure 25:
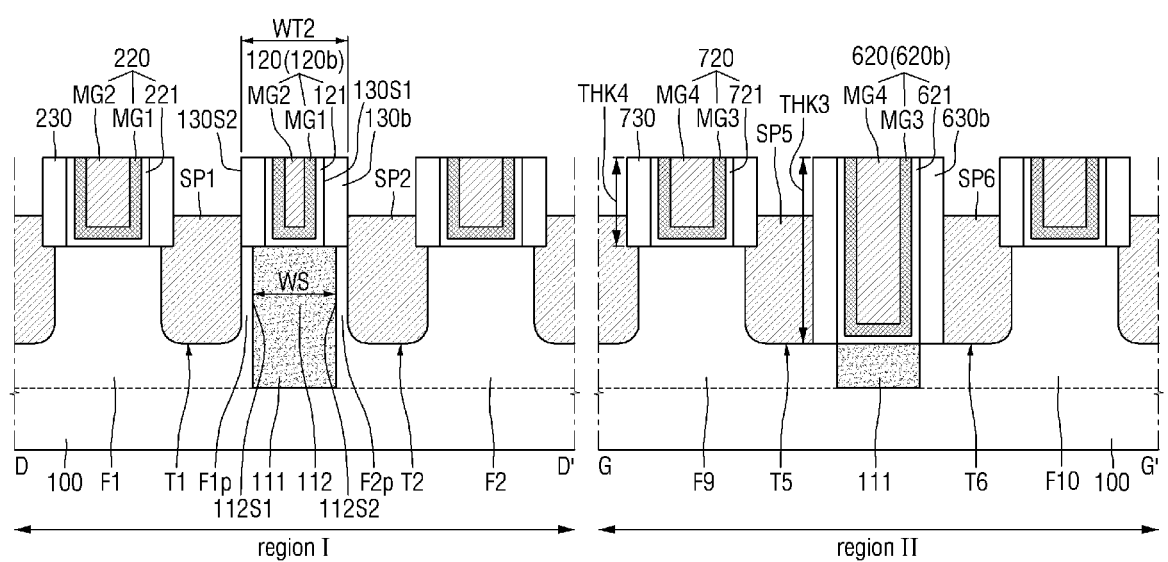
FIG. 25 is a cross-sectional view taken along the line D-D' and line G-G' of FIG. 24.

FIG. 24 is a layout diagram for explaining the semiconductor device according to some embodiments of the technical idea of the present inventive concepts. FIG. 25 is a cross-sectional view taken along the line D-D' and line G-G' of FIG. 24. FIG. 24 is a diagram illustrating the configuration in which the sixth, seventh and eighth gate spacers 630, 730, and 830 are disposed in the layout diagram of FIG. 22. In FIG. 24, the third and fourth gate electrode layers MG3 and MG4 and the gate insulating film are not illustrated for clarity of illustration.

Referring to FIGS. 24 and 25, the sixth, seventh and eighth gate spacers 630, 730, and 830 may be disposed in the second region II of the substrate 100. The first, second and third gate spacers 130, 230, and 330 described referring to FIGS. 11 and 12 may be disposed in the first region I of the substrate 100.

Each of the sixth, seventh and eighth gate spacers 630, 730, and 830 may be disposed on both sidewalls of each of the sixth, seventh and eighth gate structures 620, 720, and 820.

The sixth gate spacer 630 may include a first spacer part 630a and a second spacer part 630b. The first spacer part 630a may include a portion disposed on the first field insulating film 111 along both sidewalls of the first portion 620a of the sixth gate spacer 630. The second spacer part 630b may include a portion disposed on the first field insulating film 111 along both sidewalls of the second portion 620b of the sixth gate spacer 630.

The third thickness THK3 of the sixth gate structure 620 may be greater than the fourth thickness THK4 of the seventh gate structure 720. The third thickness THK3 may be, for example, the thickness from the upper surface of the first field insulating film 111 to the upper surface of the sixth gate structure 620. The fourth thickness THK4 may be, for example, the thickness from the boundary between the ninth fin type pattern F9 and the seventh gate structure 720 to the upper surface of the seventh gate structure 720.

Each of the fifth and sixth trenches T5 and T6 may be formed in each of the ninth and tenth fin type patterns F9 and F10. The other sidewall of the fifth trench T5 may be defined by the one sidewall of the second portion 620b of the sixth gate structure 620. The one sidewall of the sixth trench T6 may be defined by the other sidewall of the second portion 620b of the sixth gate structure 620.

Each of the fifth and sixth semiconductor patterns SP5 and SP6 may fill each of the fifth and sixth trenches T5 and T6. In some embodiments, the transistor formed using the first fin type pattern F1, the third fin type pattern F3 and the second gate structure 220 may be a PMOS transistor. In this case, the first and third semiconductor patterns SP1 and SP3 may include compressive stress materials. A transistor formed using the ninth fin type pattern F9, the eleventh fin type pattern F11, and the seventh gate structure 720 may be an NMOS transistor. In this case, the fifth and sixth semiconductor patterns SP5 and SP6 may be the same material as the substrate 100 or a tensile stress material. For example, when the substrate 100 is Si, the fifth and sixth semiconductor patterns SP5 and SP6 may be Si or a material having a smaller lattice constant than Si (e.g., SiC).

Hereinafter, the semiconductor device according to some embodiments of the technical idea of the present inventive concepts will be described with reference to FIGS. 21 and 26 to 30. For the sake of clarity of explanation, repeated parts of above description will be simplified or omitted.

Figure 26:
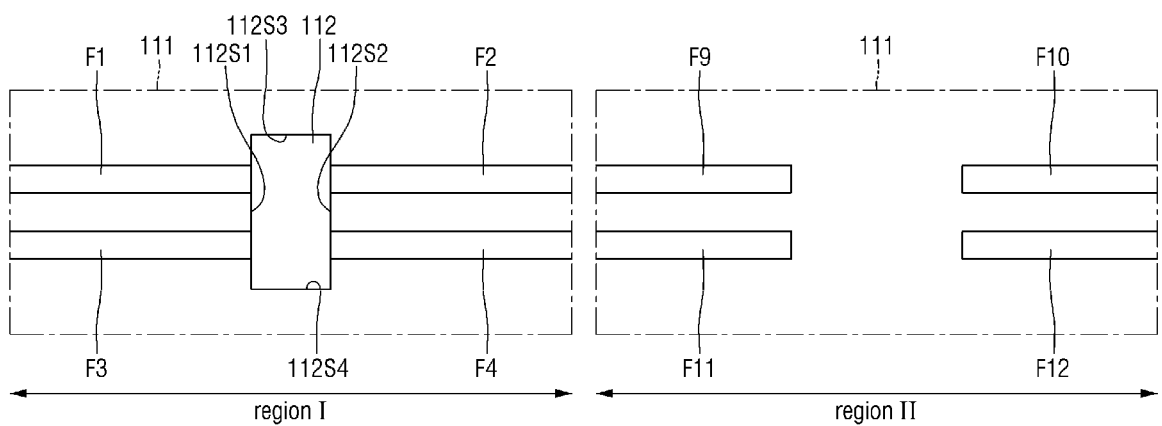
FIGS. 26 and 27 are layout diagrams for explaining the semiconductor device according to some embodiments of the technical idea of the present inventive concepts.
Figure 27:
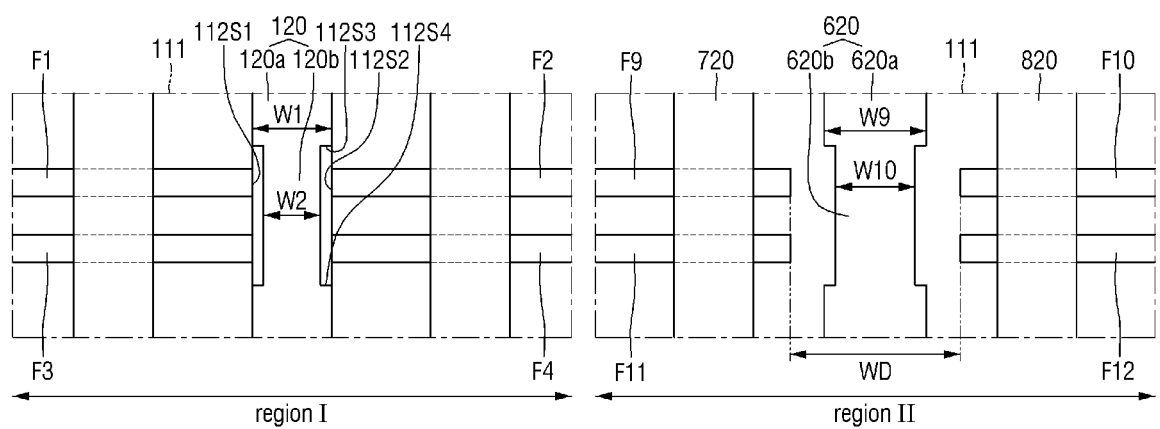
Figure 28:
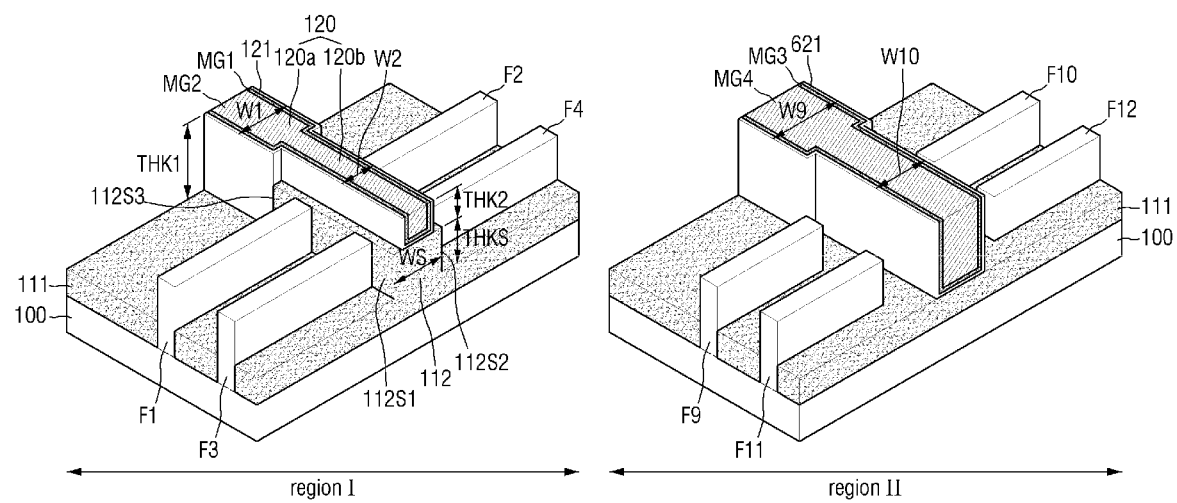
FIG. 28 is a perspective view for explaining the semiconductor device according to some embodiments of the technical idea of the present inventive concepts.

FIGS. 26 and 27 are layout diagrams for explaining the semiconductor device according to some embodiments of the technical idea of the present inventive concepts. FIG. 27 is a diagram illustrating the configuration in which the sixth, seventh, and eighth gate structures 620, 720, and 820 are disposed in the layout diagram of FIG. 26. In FIG. 27, the third and fourth gate electrode layers MG3 and MG4 and the gate insulating film are not illustrated for clarity of illustration. FIG. 28 is a perspective view for explaining the semiconductor device according to some embodiments of the technical idea of the present inventive concepts. In FIGS. 27 and 28, the gate spacer is not illustrated for clarity of illustration. FIG. 28 is a partial perspective view illustrating only a partial region of the layout of FIG. 27 for clarity of illustration.

Referring to FIGS. 26 to 28, the second portion 620b of the sixth gate structure 620 may be disposed by being spaced apart from each of the ninth, tenth, eleventh and twelfth fin type patterns F9, F10, F11, and F12. In other words, the second portion 620b of the sixth gate structure 620 may not be in contact with each of the ninth, tenth, eleventh and twelfth fin type patterns F9, F10, F11, and F12. For example, a spaced distance WD between the ninth fin type pattern F9 and the tenth fin type pattern F10, and a spaced distance WD between the eleventh fin type pattern F1.1 and the twelfth fin type pattern F12 may be greater than the tenth width W10.

Figure 29:
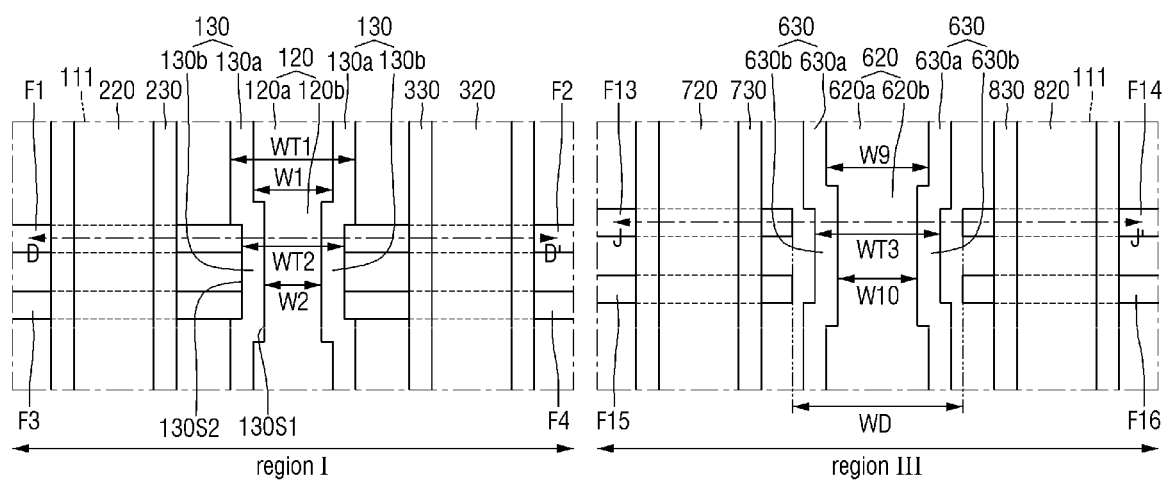
FIG. 29 is a layout diagram for explaining the semiconductor device according to some embodiments of the technical idea of the present inventive concepts.
Figure 30:
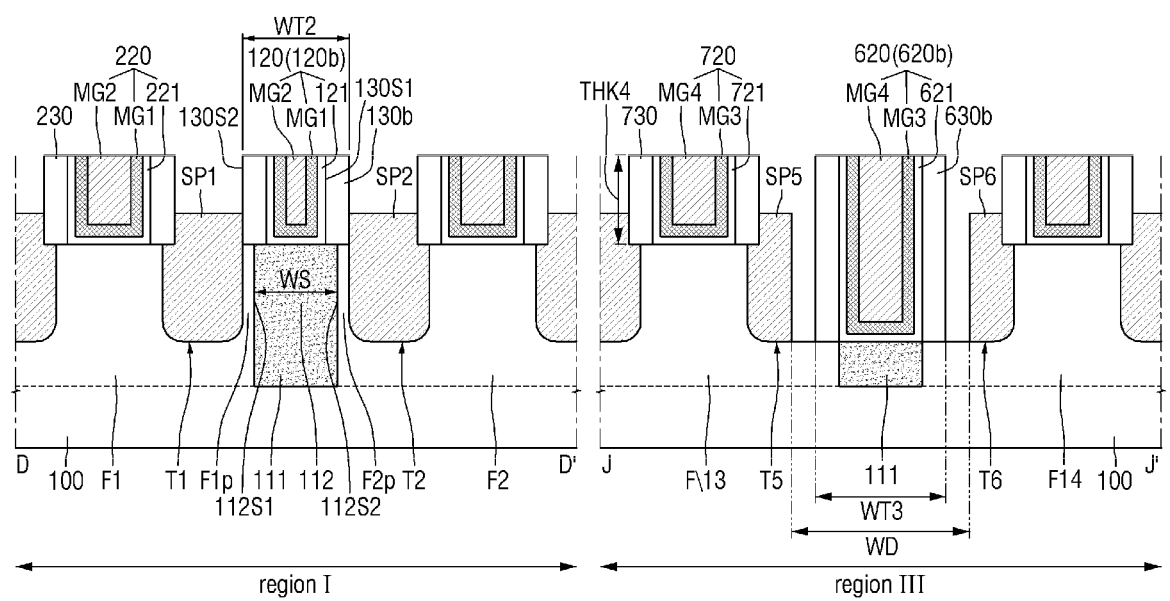
FIG. 30 is a cross-sectional view taken along the line D-D' and line J-J' of FIG. 29.

FIG. 29 is a layout diagram for explaining the semiconductor device according to some embodiments of the technical idea of the present inventive concepts. FIG. 30 is a cross-sectional view taken along the line D-D' and line J-J' of FIG. 29. FIG. 29 is a diagram illustrating the configuration in which the sixth, seventh and eighth gate spacers 630, 730, and 830 are disposed in the layout diagram of FIG. 27. In FIG. 29, the third and fourth gate electrode layers MG3 and MG4 and the gate insulating film are not illustrated for clarity of illustration.

Referring to FIGS. 29 and 30, the second spacer part 630b may be disposed by being spaced apart from each of the ninth, tenth, eleventh and twelfth fin type patterns F9, F10, F11, and F12. In other words, the second spacer part 630b may not be in contact with each of the ninth, tenth, eleventh and twelfth fin type patterns F9, F10, F11, and F12. For example, the spaced distance WD between the ninth fin type pattern F9 and the tenth fin type pattern F10, and the spaced distance WD between the eleventh fin type pattern F11 and the twelfth fin type pattern F12 may be larger than the sum total WT3 of the tenth width W10 of the second portion 620b of the sixth gate structure 620 and the width of the second spacer part 630b.

In some embodiments, each of the fifth and sixth semiconductor patterns SP5 and SP6 may be disposed by being spaced apart from the second spacer part 630b.

Hereinafter, a method of manufacturing a semiconductor device according to some embodiments of the technical idea of the present inventive concepts will be described with reference to FIGS. 2, 3, 5, 12, and 31 to 36. For the sake of clarity of explanation, repeated parts of above description will be simplified or omitted.

Figure 31:
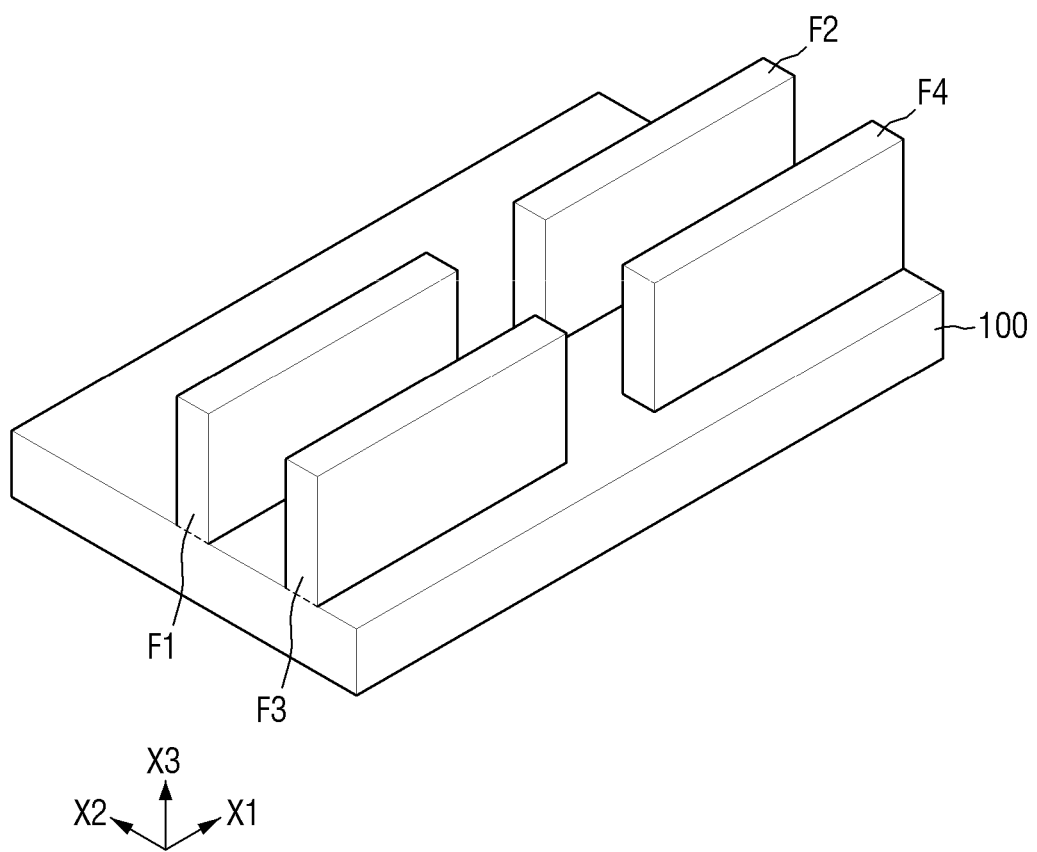
FIGS. 31 to 36 are intermediate step diagrams for explaining a method for manufacturing a semiconductor device according to some embodiments of the technical idea of the present inventive concepts.
Figure 32:
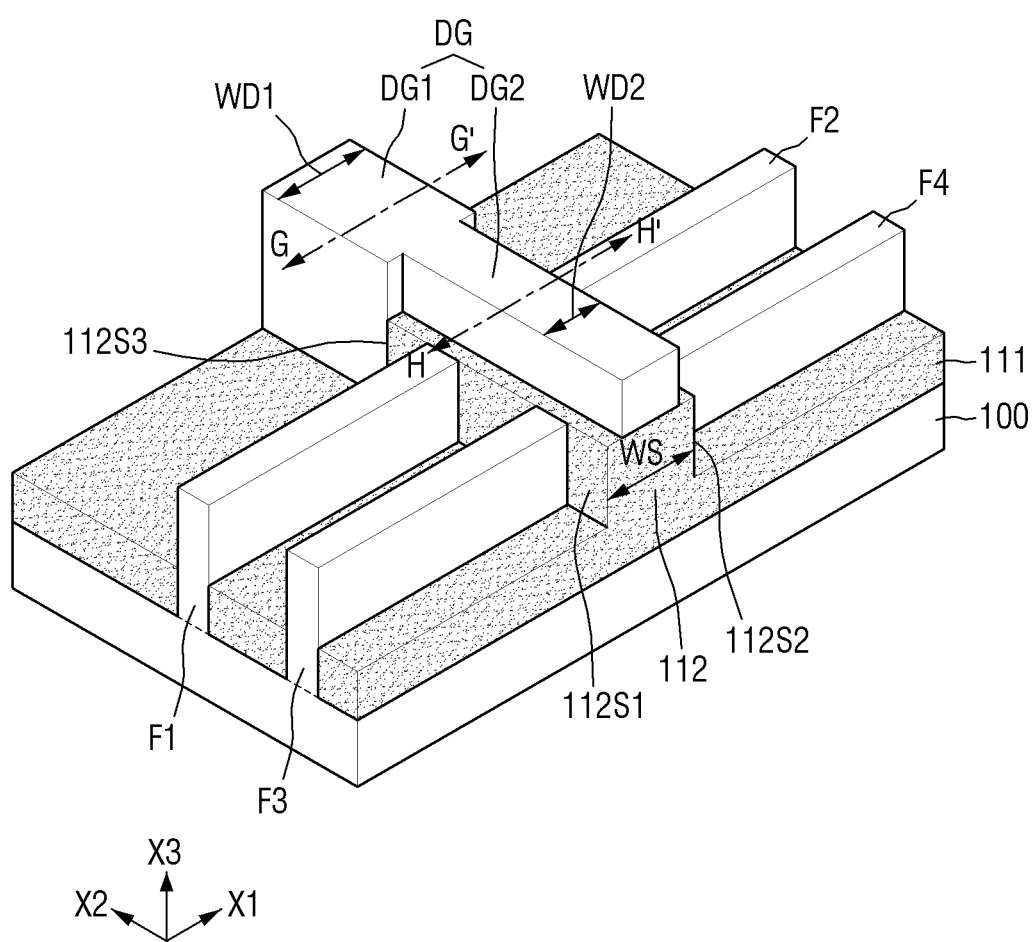

FIGS. 31 to 36 are intermediate step diagrams for explaining the method for manufacturing the semiconductor device according to some embodiments of the technical idea of the present inventive concepts. In FIG. 32, the first gate spacer 130, the dummy gate insulating film DGa, the dummy gate electrode DGb and the hard mask DGc are not illustrated for clarity of illustration.

Referring to FIG. 31, first and second fin type patterns F1 and F2 formed on the substrate 100 may be provided.

Referring to FIG. 2, the first field insulating film 111 may be formed on the substrate 100 to wrap at least a part of each of the first and second fin type patterns F1 and F2.

Referring to FIG. 3, a second field insulating film 112 protruding from the first field insulating film 111 may be formed between the first and second fin type patterns F1 and F2.

Referring to FIG. 32, a dummy gate structure DG may be formed on the first and second field insulating films 111 and 112. The dummy gate structure DG may extend over the first and second field insulating films 111 and 112 in the second direction X2. The dummy gate structure DG may extend in the second direction X2 between the first and second fin type patterns F1 and F2. The dummy gate structure DG may include a first portion DG1 and a second portion DG2.

The first portion DG1 of the dummy gate structure DG may be a portion on the first field insulating film 111. The first portion DG1 of the dummy gate structure DG may be a portion which does not overlap the second field insulating film 112 in the third direction X3. In some embodiments, the first portion DG1 of the dummy gate structure DG may be a portion which is not disposed between the first fin type pattern F1 and the second fin type pattern F2. The first portion DG1 of the dummy gate structure DG may be in contact with the third sidewall 112S3 of the second field insulating film 112. The first portion DG1 of the dummy gate structure DG may be a portion having a first width WD1.

The second portion DG2 of the dummy gate structure DG may be a portion on the second field insulating film 112. The second portion DG2 of the dummy gate structure DG may be a portion which overlaps the second field insulating film 112 in the third direction X3. In some embodiments, the second portion DG2 of the dummy gate structure DG may be a portion disposed between the first fin type pattern F1 and the second fin type pattern F2. The second portion DG2 of the dummy gate structure DG may be a portion having a second width WD2.

The first width WD1 of the first portion DG1 of the dummy gate structure DG may be greater than the second width WD2 of the second portion DG2 of the dummy gate structure DG. The width WS of the second field insulating film 112 may be, for example, greater than the second width WD2 of the second portion DG2 of the dummy gate structure DG.

Figure 33:
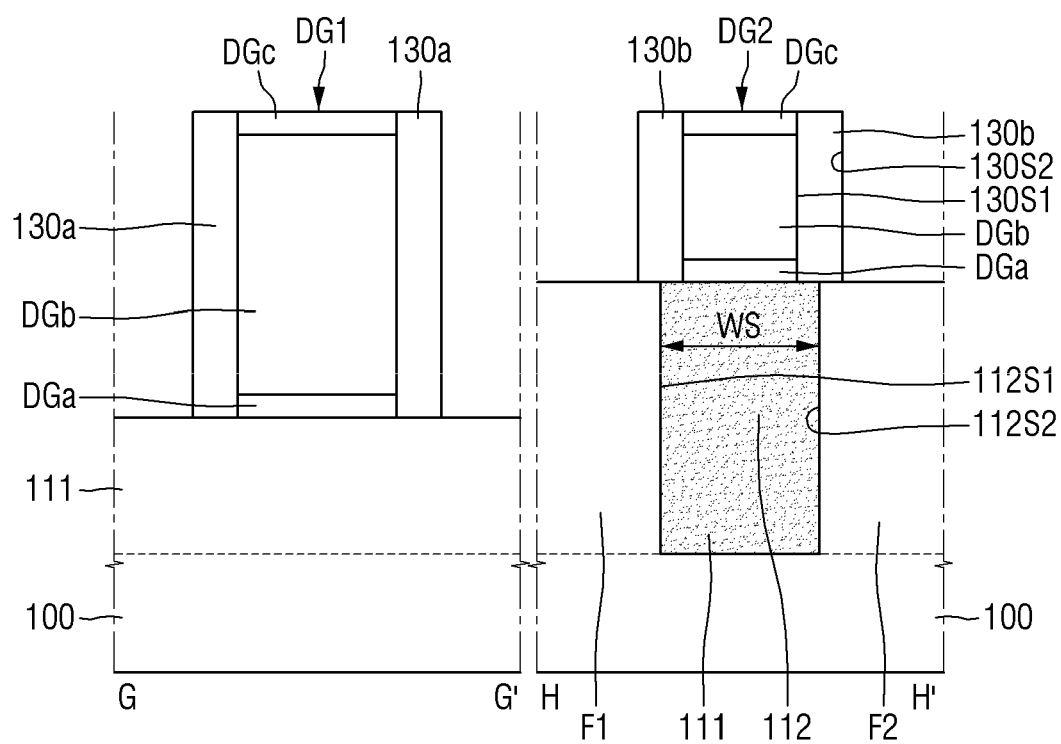

FIG. 33 is a cross-sectional view taken along line G-G' and line H-H' of FIG. 27.

Referring to FIG. 33, a first gate spacer 130 may be formed on the sidewall of the dummy gate structure DG. The first spacer part 130a of the first gate spacer 130 may be formed on the sidewall of the first portion DG1 of the dummy gate structure DG. The second spacer part 130b of the first gate spacer 130 may be formed on the sidewall of the second portion DG2 of the dummy gate structure DG.

The outer sidewall 130S2 of the second spacer part 130b may be located on the first fin type pattern F1 and the second fin type pattern F2.

The dummy gate structure DG may include a dummy gate insulating film DGa, a dummy gate electrode DGb and a hard mask DGc sequentially stacked between the first gate spacers 130.

The dummy gate insulating film DGa may be formed on the first and second field insulating films 111 and 112. The dummy gate electrode DGb may be formed on the dummy gate insulating film DGa. The dummy gate electrode DGb may be, for example, polysilicon. The hard mask DGc may be formed on the dummy gate electrode DGb.

Figure 34:
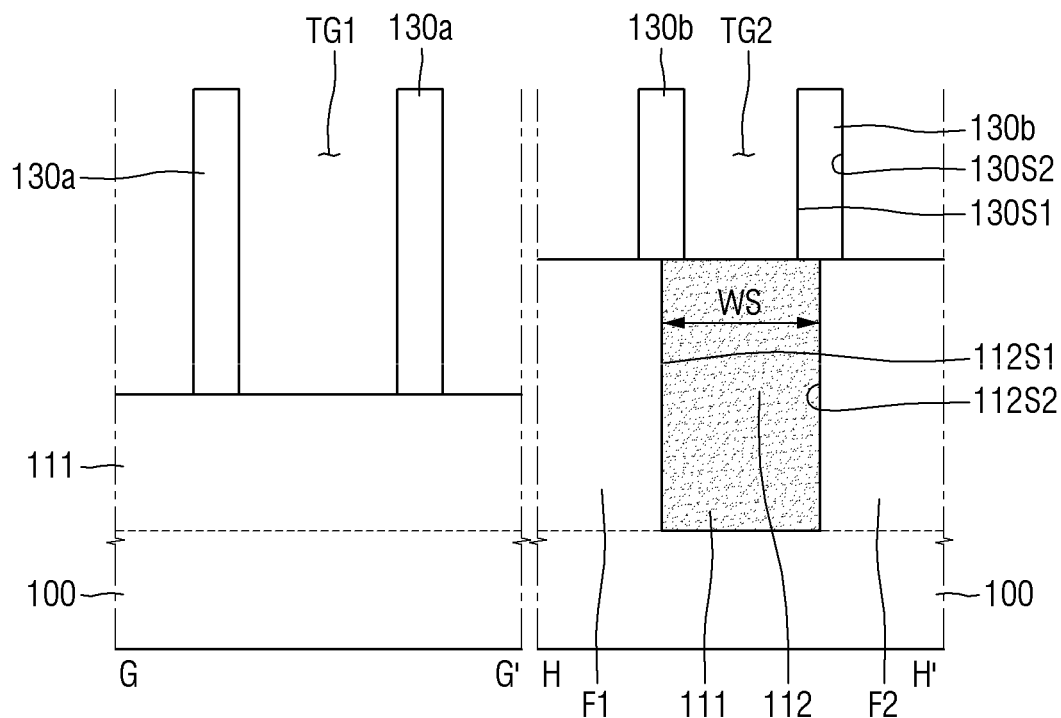

Referring to FIG. 34, the dummy gate insulating film DGa, the dummy gate electrode DGb and the hard mask DGc are removed to form the first and second gate trenches TG1 and TG2.

For example, the first gate trench TG1 may be formed by removal of the first portion DG1 of the dummy gate structure DG. The bottom surface of the first gate trench TG1 may be defined by the first field insulating film 111. The sidewall of the first gate trench TG1 may be defined by the first spacer part 130a.

For example, the second gate trench TG2 may be formed by removal of the second portion DG2 of the dummy gate structure DG. The bottom surface of the second gate trench TG2 may be defined by the second field insulating film 112. The sidewall of the second gate trench TG2 may be defined by the inner sidewall 130S1 of the second spacer part 130b.

Figure 35:
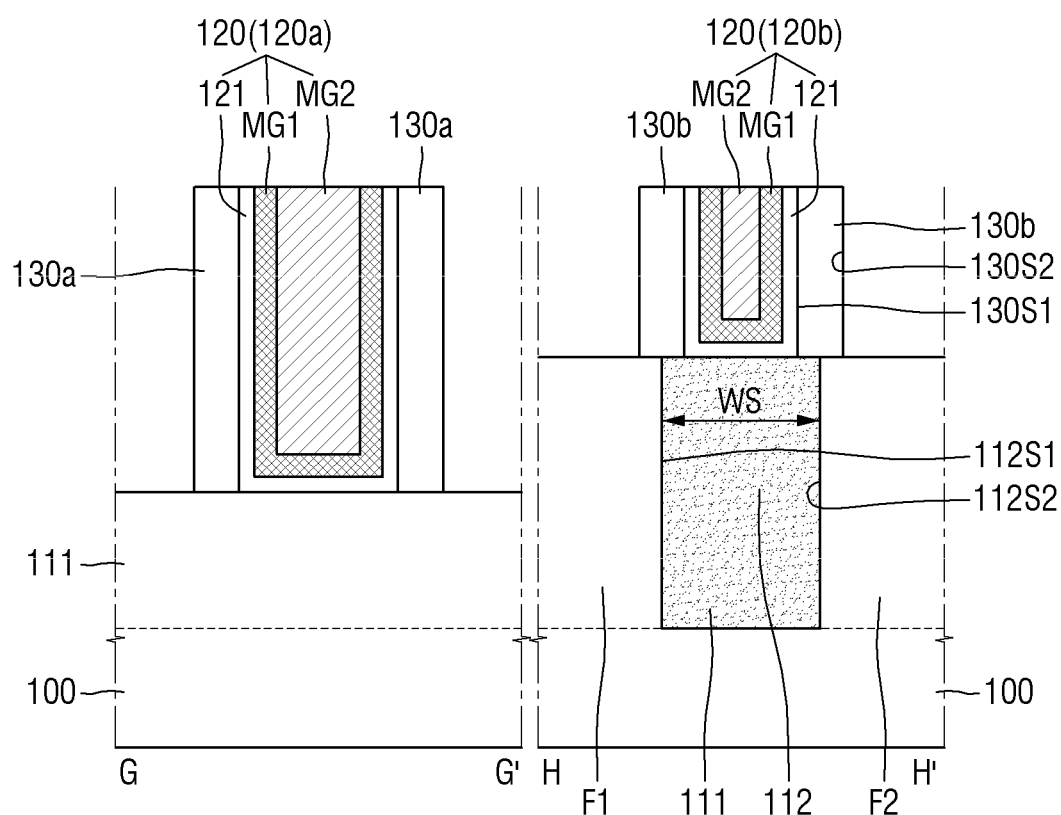

Referring to FIG. 35, the first gate structure 120 including the first portion 120a and the second portion 120b may be formed. The first gate structure 120 may be formed as illustrated in FIG. 5.

The first portion 120a of the first gate structure 120 may be formed in the first gate trench TG1. The second portion 120b of the first gate structure 120 may be formed in the second gate trench TG2. The first gate insulating film 121 may be formed along the sidewalls and the bottom surfaces of the first and second gate trenches TG1 and TG2. The first gate electrode layer MG1 may be formed on the first gate insulating film 121 along the profile of the first gate insulating film 121. The second gate electrode layer MG2 may be formed on the first gate electrode layer MG1 to fill the first and second gate trenches TG1 and TG2.

Figure 36:
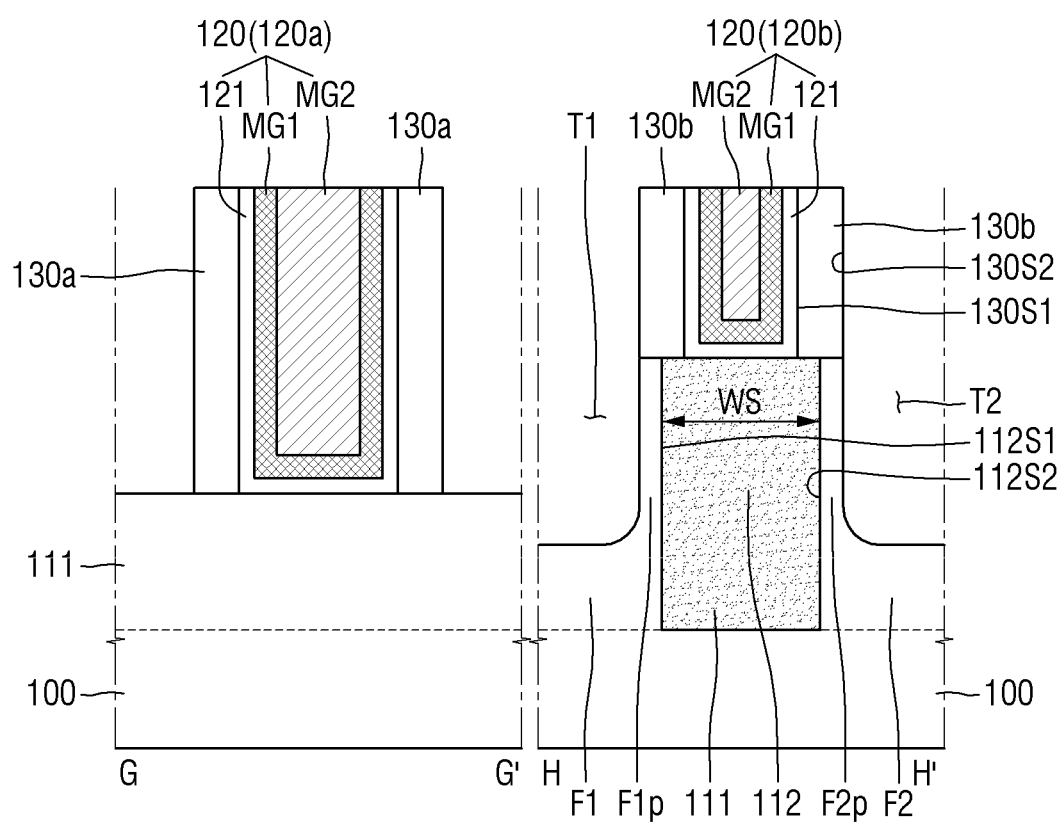

Referring to FIG. 36, each of the first and second trenches T1 and T2 may be formed in each of the first and second fin type patterns F1 and F2.

Each of the first and second trenches T1 and T2 may be formed in each of the first and second fin type patterns F1 and F2, using the second spacer part 130b and the second portion 120b of the first gate structure 120 as an etching mask. As a result, only a part F1p of the first fin type pattern F1 may remain between the first trench T1 and the second field insulating film 112. A part F2p of the second fin type pattern F2 may remain between the second trench T2 and the second field insulating film 112.

Each of the first and second semiconductor patterns (SP1 and SP2 of FIG. 12) may be formed by filling each of the first and second trenches T1 and T2.

While the present inventive concepts have been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
   a first fin type pattern and a second fin type pattern extending in a first direction and spaced apart from each other in the first direction;
   a first field insulating film around at least a part of the first fin type pattern and at least a part of the second fin type pattern;
   a second field insulating film between the first fin type pattern and the second fin type pattern and protruding from the first field insulating film;
   a first gate structure which extends over the first and second field insulating films in a second direction intersecting with the first direction, and includes a first portion on the first field insulating film, and a second portion on the second field insulating film; and
   a first gate spacer including a first spacer part on the first field insulating film along one sidewall of the first portion of the first gate structure, and a second spacer part on the second field insulating film along one sidewall of the second portion of the first gate structure,
   wherein a first width of the first portion of the first gate structure is greater than a second width of the second portion of the first gate structure, and
   wherein the second spacer part includes a first sidewall in contact with the sidewall of the second portion, and a second sidewall facing the first sidewall, and the second sidewall is on the second field insulating film.

2. The semiconductor device of claim 1, wherein the first portion of the first gate structure does not overlap the second field insulating film in a third direction, and
   the third direction is a direction perpendicular to an upper surface of the first field insulating film.

3. The semiconductor device of claim 2, wherein a first thickness of the first portion of the first gate structure is greater than a second thickness of the second portion of the first gate structure, and
   the first thickness and the second thickness are in the third direction.

4. The semiconductor device of claim 1, further comprising:
   a third fin type pattern and a fourth fin type pattern spaced apart from the first and second fin type patterns in the second direction, extend in the first direction, and spaced apart from each other in the first direction; and
   a third field insulating film between the third fin type pattern and the fourth fin type pattern and protruding from the first field insulating film,
   wherein the first field insulating film around at least a part of the third fin type pattern and at least a part of the fourth fin type pattern,
   the first gate structure further includes a third portion on the third field insulating film, and
   the second width is smaller than a third width of the third portion.

5. The semiconductor device of claim 1, further comprising:
   a third fin type pattern and a fourth fin type pattern spaced apart from the first and second fin type patterns, extend in the first direction, and spaced apart from each other in the first direction;
   a third field insulating film between the third fin type pattern and the fourth fin type pattern and protruding from the first field insulating film; and
   a second gate structure spaced apart from the first gate structure, extends over the first and third field insulating films in the second direction, and includes a third portion on the first field insulating film, and a fourth portion on the third field insulating film,
   wherein the first field insulating film around at least a part of the third fin type pattern and at least a part of the fourth fin type pattern, and
   a third width of the third portion of the second gate structure is the same as a fourth width of the fourth portion of the second gate structure.

6. The semiconductor device of claim 1, further comprising:
   a second gate structure extending in the second direction and spaced apart from the first gate structure, on the first field insulating film and the first fin type pattern,
   wherein the second gate structure includes a third portion on the first field insulating film and a fourth portion on the first fin type pattern, and
   a width of the third portion is the same as a width of the fourth portion.

7. The semiconductor device of claim 1, further comprising:
   wherein the sum of the first width and a width of the first spacer part is larger than the sum of the second width and a width of the second spacer part.

8. The semiconductor device of claim 1, further comprising:
   a substrate including a first region and a second region;

a third fin type pattern and a fourth fin type pattern in the second region, extending in the first direction and spaced apart from each other in the first direction; and a second gate structure in the second region and extending in the second direction between the third fin type pattern and the fourth fin type pattern, wherein the first fin type pattern, the second fin type pattern, the first field insulating film, the second field insulating film, and the first gate structure are in the first region of the substrate, the first field insulating film around at least a part of each of the third fin type pattern and the fourth fin type pattern, the second gate structure includes a third portion on the first field insulating film, and a fourth portion between the third and fourth fin type patterns, and a third width of a third portion of the second gate structure is greater than a fourth width of a fourth portion of the second gate structure.

9. The semiconductor device of claim 8, wherein the fourth portion is spaced apart from each of the third and fourth fin type patterns.

10. A semiconductor device comprising:

a first fin type pattern and a second fin type pattern extending in a first direction and spaced apart from each other in the first direction;

a first field insulating film around at least a part of the first fin type pattern and at least a part of the second fin type pattern;

a second field insulating film between the first fin type pattern and the second fin type pattern and protruding from the first field insulating film;

a first gate structure which extends over the first and second field insulating films in a second direction intersecting with the first direction, and including a first portion on the first field insulating film, and a second portion on the second field insulating film; and a first gate spacer including a first spacer part on the first field insulating film along both sidewalls of a first portion of the first gate structure, and a second spacer part on the second field insulating film along both sidewalls of the second portion of the first gate structure, wherein the sum of a first width of the first portion of the first gate structure and a width of the first spacer part is greater than the sum of a second width of the second portion of the first gate structure and a width of the second spacer part.

11. The semiconductor device of claim 10, wherein the first width of the first portion of the first gate structure is greater than the second width of the second portion of the first gate structure.

12. The semiconductor device of claim 11, wherein the first portion of the first gate structure does not overlap the second field insulating film in a third direction, and the third direction is a direction perpendicular to an upper surface of the first field insulating film.

13. The semiconductor device of claim 12, wherein a first thickness of the first portion of the first gate structure is greater than a second thickness of the second portion of the first gate structure, and the first thickness and the second thickness are in the third direction.

14. The semiconductor device of claim 10, wherein the second spacer part includes a first sidewall in contact with both sidewalls of the second portion, and a second sidewall facing the first sidewall, and the second sidewall is on the second field insulating film.

15. The semiconductor device of claim 10, wherein the sum of the second width of the second portion of the first gate structure and the width of the second spacer part is greater than the width of the second field insulating film.

16. A semiconductor device comprising:

a first fin type pattern and a second fin type pattern extending in a first direction and spaced apart from each other in the first direction;

a first field insulating film around at least a part of the first fin type pattern and at least a part of the second fin type pattern;

a first gate structure on the first field insulating film and extending in a second direction intersecting with the first direction between the first fin type pattern and the second fin type pattern; and a third fin type pattern and a fourth fin type pattern spaced apart from the first and second fin type patterns in the second direction, extend in the first direction, and spaced apart from each other in the first direction, wherein the first gate structure includes a first portion which is not between the first fin type pattern and the second fin type pattern, and a second portion which is between the first fin type pattern and the second fin type pattern, a first width of the first portion of the first gate structure is greater than a second width of a second portion of the first gate structure, and wherein the first field insulating film around at least a part of the third fin type pattern and at least a part of the fourth fin type pattern, the first gate structure further includes a third portion between the third fin type pattern and the fourth fin type pattern, and the second width is smaller than a third width of the third portion.

17. The semiconductor device of claim 16, further comprising:

a second field insulating film between the first fin type pattern and the second fin type pattern and protruding from the first field insulating film, wherein the second portion of the first gate structure is on the second field insulating film.

* * * * *